US012628569B2

(12) United States Patent
Shibata et al.

(10) Patent No.: US 12,628,569 B2
(45) Date of Patent: May 12, 2026

(54) LIGHT DETECTION ELEMENT HAVING FIRST AND SECOND FERROMAGNETIC LAYERS SANDWICHING SPACER LAYER AND RECEIVING DEVICE

(71) Applicant: TDK CORPORATION, Tokyo (JP)

(72) Inventors: Tetsuya Shibata, Tokyo (JP); Hideaki Fukuzawa, Tokyo (JP); Tomohito Mizuno, Tokyo (JP); Arata Tsukamoto, Tokyo (JP); Yuichi Kasatani, Funabashi (JP)

(73) Assignee: TDK CORPORATION, Tokyo (JP)

( * ) Notice: Subject to any disclaimer, the term of this patent is extended or adjusted under 35 U.S.C. 154(b) by 469 days.

(21) Appl. No.: 18/133,639

(22) Filed: Apr. 12, 2023

(65) Prior Publication Data

US 2023/0337546 A1      Oct. 19, 2023

(30) Foreign Application Priority Data

Apr. 19, 2022   (JP) ................................ 2022-068947
Nov. 29, 2022   (JP) ................................ 2022-189938

(51) Int. Cl.
*H10N 50/10*        (2023.01)
*G01J 1/46*          (2006.01)
*H10N 50/80*        (2023.01)

(52) U.S. Cl.
CPC ................ *H10N 50/10* (2023.02); *G01J 1/46* (2013.01); *H10N 50/80* (2023.02)

(58) Field of Classification Search
CPC ......... H10N 50/10; H10N 50/80; H10N 59/00
See application file for complete search history.

(56) References Cited

U.S. PATENT DOCUMENTS

| | | | |
|---|---|---|---|
| 6,925,261 B2 | 8/2005 | Haruyama | |
| 2001/0040713 A1 | 11/2001 | Maruyama | |
| 2004/0207961 A1 * | 10/2004 | Ichimura | ................ B82Y 25/00 |
| 2009/0219638 A1 * | 9/2009 | Iwata | ................... G11B 5/3903 |
| | | | 360/59 |
| 2015/0333839 A1 | 11/2015 | Li et al. | |
| 2017/0238834 A1 * | 8/2017 | Kawabata | ................ A61B 5/05 |

(Continued)

FOREIGN PATENT DOCUMENTS

JP        2001-292107 A     10/2001

OTHER PUBLICATIONS

Chen et al., "All-Optical Switching of Magnetic Tunnel Junctions with Single Subpicosecond Laser Pulses", Physical Review Applied 7, 021001, 2017.

(Continued)

*Primary Examiner* — William B Partridge
*Assistant Examiner* — Felix B Andrews
(74) *Attorney, Agent, or Firm* — OLIFF PLC.

(57)        ABSTRACT

A light detection element include: a magnetic element, a capacitor, and a resistor, wherein the magnetic element and the capacitor are connected in series, the resistor is connected to the magnetic element and the capacitor in parallel, the magnetic element includes a first ferromagnetic layer, a second ferromagnetic layer, and a spacer layer sandwiched between the first ferromagnetic layer and the second ferromagnetic layer, and the magnetic element is configured to be irradiated with a light containing an optical signal with a change of intensity of the light.

6 Claims, 19 Drawing Sheets

(56)  References Cited

U.S. PATENT DOCUMENTS

| 2019/0157345 | A1 * | 5/2019 | Zhu | H10B 61/00 |
| 2019/0245254 | A1 * | 8/2019 | Yamane | H03B 15/00 |
| 2019/0305215 | A1 * | 10/2019 | Degawa | G01R 33/093 |
| 2022/0010423 | A1 | 1/2022 | Suzuki et al. | |
| 2022/0068537 | A1 | 3/2022 | Mizuno et al. | |

OTHER PUBLICATIONS

Azim et al., "Optical Receiver With Helicity-Dependent Magnetization Reversal", IEEE Transactions on Magnetics, vol. 55, No. 1, Jan. 2019, Art No. 4400206.

* cited by examiner

100

24

25

26

23

21 (21A)

90

LIGHT DETECTION ELEMENT HAVING FIRST AND SECOND FERROMAGNETIC LAYERS SANDWICHING SPACER LAYER AND RECEIVING DEVICE

CROSS-REFERENCES TO RELATED APPLICATIONS

This application relies for priority upon Japanese Patent Application No. 2022-068947 filed on Apr. 19, 2022, and Japanese Patent Application No. 2022-189938 filed on Nov. 29, 2022, the entire contents of which are hereby incorporated herein by reference for all purposes as if fully set forth herein.

BACKGROUND

The present disclosure relates to a light detection element and a receiving device.

Communication traffic volumes have dramatically increased with the spread of the Internet, and the importance of optical communication has increased significantly. Optical communication involves communication means configured to convert an electric signal into an optical signal and perform transmission and reception using the optical signal.

For example, Patent Document 1 discloses a receiving device configured to receive an optical signal using a photo diode. The photo diode is, for example, a p-n junction diode or the like using a p-n junction of a semiconductor.

[Patent Document 1] Japanese Unexamined Patent Application, First Publication No. 2001-292107

SUMMARY

While a light detection element using a p-n junction of a semiconductor is widely used, a new breakthrough is required for further development. In addition, there is a need to study a configuration that considers an actual use of the new light detection element.

It is desirable to provide a novel light detection element and receiving device in consideration of actual use.

The following means are provided.

A light detection element including: a magnetic element, a capacitor, and a resistor, wherein the magnetic element and the capacitor are connected in series, the resistor is connected to the magnetic element and the capacitor in parallel, the magnetic element includes a first ferromagnetic layer, a second ferromagnetic layer, and a spacer layer sandwiched between the first ferromagnetic layer and the second ferromagnetic layer, and the magnetic element is configured to be irradiated with a light containing an optical signal with a change of intensity of the light.

A light detection element including: a magnetic element, a resistor, and an inductor, wherein the magnetic element and the resistor are connected in series, the inductor is connected to the magnetic element and the resistor in parallel, the magnetic element includes a first ferromagnetic layer, a second ferromagnetic layer, and a spacer layer sandwiched between the first ferromagnetic layer and the second ferromagnetic layer, and the magnetic element is configured to be irradiated with a light containing an optical signal with a change of intensity of the light.

A receiving device including a magnetic element and a circuit, wherein the magnetic element includes a first ferromagnetic layer, a second ferromagnetic layer, and a spacer layer sandwiched between the first ferromagnetic layer and the second ferromagnetic layer, the magnetic element is configured to be irradiated with a light containing an optical signal with a change of intensity of the light, the circuit is connected to the magnetic element and is configured to output a voltage with a magnitude corresponding to an amount of change per unit time of an output voltage output from the magnetic element according to the optical signal, and the receiving device is configured to receive the optical signal on a basis of the voltage output from the circuit.

DETAILED DESCRIPTION

Figure 1:
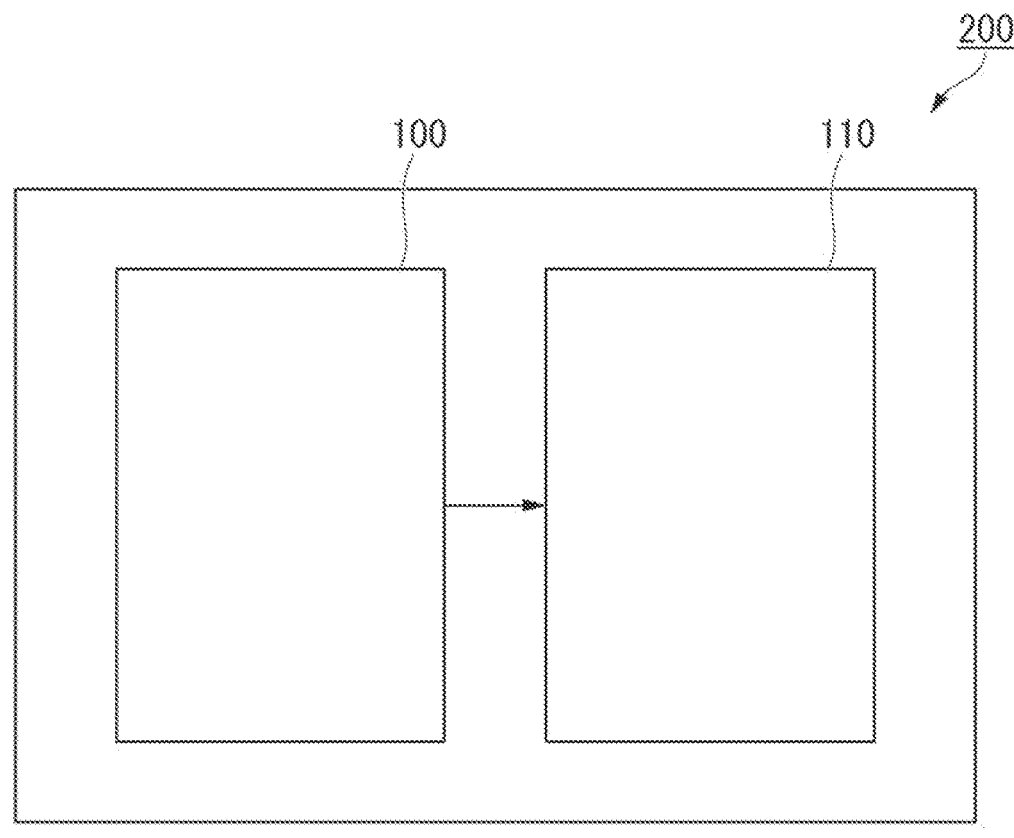
FIG. 1 is a block diagram of a receiving device according to a first embodiment.

Hereinafter, embodiments will be described in detail with reference to the accompanying drawings. In the drawings used in the following description, feature parts may be enlarged for convenience in order to make features easier to understand, and a dimensional ratio or the like of each component may differ from the actual one. Materials, dimensions, or the like exemplified in the following description are examples, and the present disclosure is not limited to them and it is possible to change them appropriately within the range where the effect of the present disclosure is exhibited.

The light detection element and the receiving device according to the aspect have a configuration that enables detection of a change in intensity of light with a new principle and also considers an actual use.

Directions will be defined below. A laminating direction of a magnetic element 10 is referred to as a z direction, one direction in a surface perpendicular to the z direction is referred to as an x direction, and a direction perpendicular to the x direction and the z direction is referred to as a y direction. The z direction is an example of the laminating direction. Hereinafter, a +z direction may be expressed as "upward" and a −z direction may be expressed as "downward." The +z direction is a direction from a second ferromagnetic layer 2 toward a first ferromagnetic layer 1. Upward and downward do not necessarily match the direction in which the gravity is applied.

First Embodiment

FIG. 1 is a block diagram of a receiving device 200 according to a first embodiment. The receiving device 200 includes a light detection element 100 and a signal processing unit 110.

The light detection element 100 converts light including an optical signal with a change of intensity of the light into an electric signal. The light in the specification is not limited to visible light and also includes infrared light with a longer wavelength than visible light, or ultraviolet light with a shorter wavelength than visible light. The wavelength of visible light is, for example, 380 nm or more and less than 800 nm. The wavelength of infrared light is, for example, 800 nm or more and 1 mm or less. The wavelength of ultraviolet light is, for example, 200 nm or more and less than 380 nm.

The signal processing unit 110 processes the electric signal received from the light detection element 100. The signal processing unit 110 has, for example, a signal receiving portion and a processor. The signal receiving portion is an input terminal of the signal processing unit 110. The signal receiving portion may include an amplifier configured to amplify the signal input to the input terminal. The processor is, for example, a central processing unit (CPU). The signal processing unit 110 may have a memory configured to store processed data. The data processed by the signal processing unit 110 is output to the outside.

Figure 2:
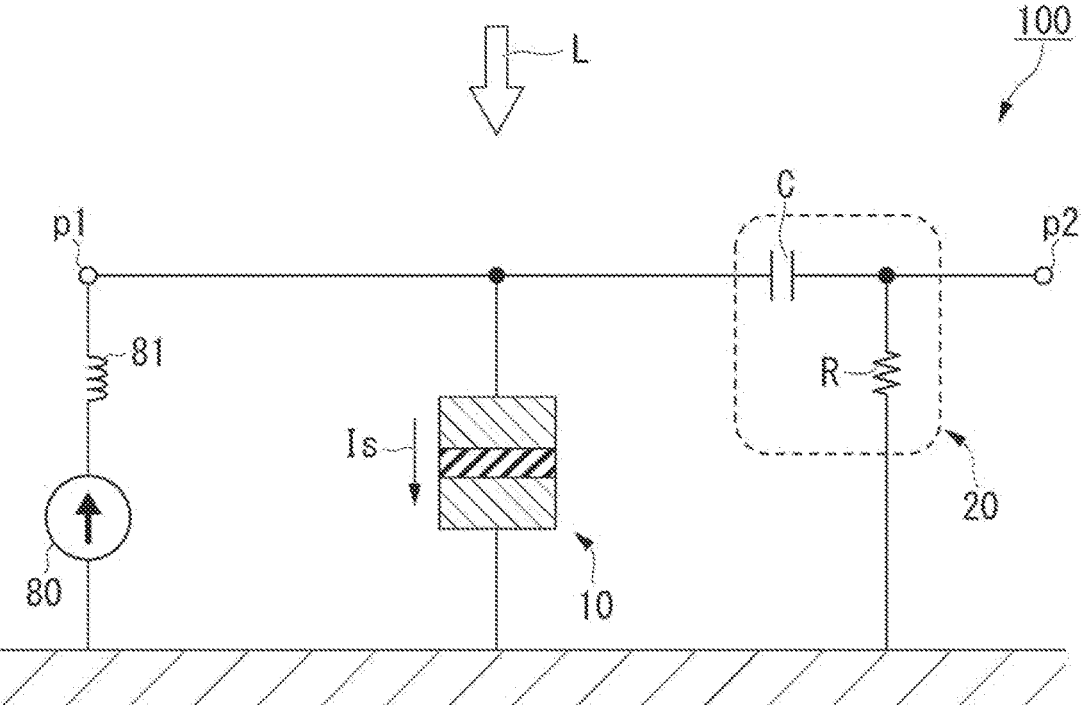
FIG. 2 is a circuit diagram of a light detection element according to the first embodiment.

FIG. 2 is a circuit diagram of the light detection element 100 according to the first embodiment. The light detection element 100 includes, for example, the magnetic element 10, a circuit 20, a first terminal p1, and a second terminal p2. The light detection element 100 outputs the electric signal when the light L including the optical signal with a change of intensity of the light is applied to the magnetic element 10. The light L includes an optical signal having a light intensity change. The light L has a change of intensity.

The first terminal p1 is a connecting terminal to the magnetic element 10. A power supply 80 is connected to the first terminal p1. A known power supply can be used as the power supply 80. The power supply 80 may be, for example, a direct current source configured to generate a constant direct current. The power supply 80 may be a direct current source configured to change a magnitude of the generated direct current value. The power supply 80 applies a sense current Is to the magnetic element 10. In addition, an inductor 81 may be provided between the power supply 80 and the magnetic element 10. A chip inductor, an inductor by a pattern line, a resistor element having an inductor component, or the like may be used as the inductor 81. When there is no need to flow the current from the outside to the magnetic element 10, the first terminal p1 and the power supply 80 may be removed.

The second terminal p2 is an output terminal of the light detection element 100. The light detection element 100 outputs the electric signal from the second terminal p2. The second terminal p2 connects the circuit 20 and the signal processing unit 110. The optical signal detected by the light detection element 100 is converted into the electric signal, and sent from the second terminal p2 to the signal processing unit 110.

In the magnetic element 10, a side of a lower electrode E2 (to be described below) is connected to a reference potential. In the circuit 20, a resistor R (to be described below) is connected to the reference potential. The reference potential in FIG. 2 is a ground. The ground may be provided outside the light detection element 100. The reference potential may be other than the ground.

The circuit 20 is a circuit configured to output a voltage of a magnitude corresponding to the amount of change per unit time of the output voltage output from the magnetic element 10 by irradiation of the light L including the optical signal. The input voltage input to the circuit 20 corresponds to the output voltage output from the magnetic element 10 by radiation of the light L including the optical signal. The voltage of the magnitude corresponding to the amount of change per unit time of the output voltage output from the magnetic element 10 corresponds to, for example, the inclination of the graph in which time is represented by a lateral axis and an output voltage output from the magnetic element 10 is represented as a longitudinal axis. The circuit 20 is, for example, a differential circuit configured to output a voltage corresponding to a value obtained by differentiating the input voltage input to the circuit 20 by time.

The circuit 20 is, for example, a CR circuit including a capacitor C and the resistor R as shown in FIG. 2. The CR circuit outputs the voltage of the magnitude corresponding to the amount of change per unit time of the input voltage input to the CR circuit, substantially like the differential circuit, by adjusting the capacity of the capacitor C and the resistance value of the resistor R. The capacitor C is connected to the magnetic element 10 in series between the reference potential and the second terminal p2. The resistor R is connected in parallel to the magnetic element 10 and the capacitor C, which are connected in series, between the reference potential and the second terminal p2. When seen in a route including the magnetic element 10, the capacitor C and the resistor R, the magnetic element 10, the capacitor C and the resistor R are sequentially connected in series.

Figure 3:
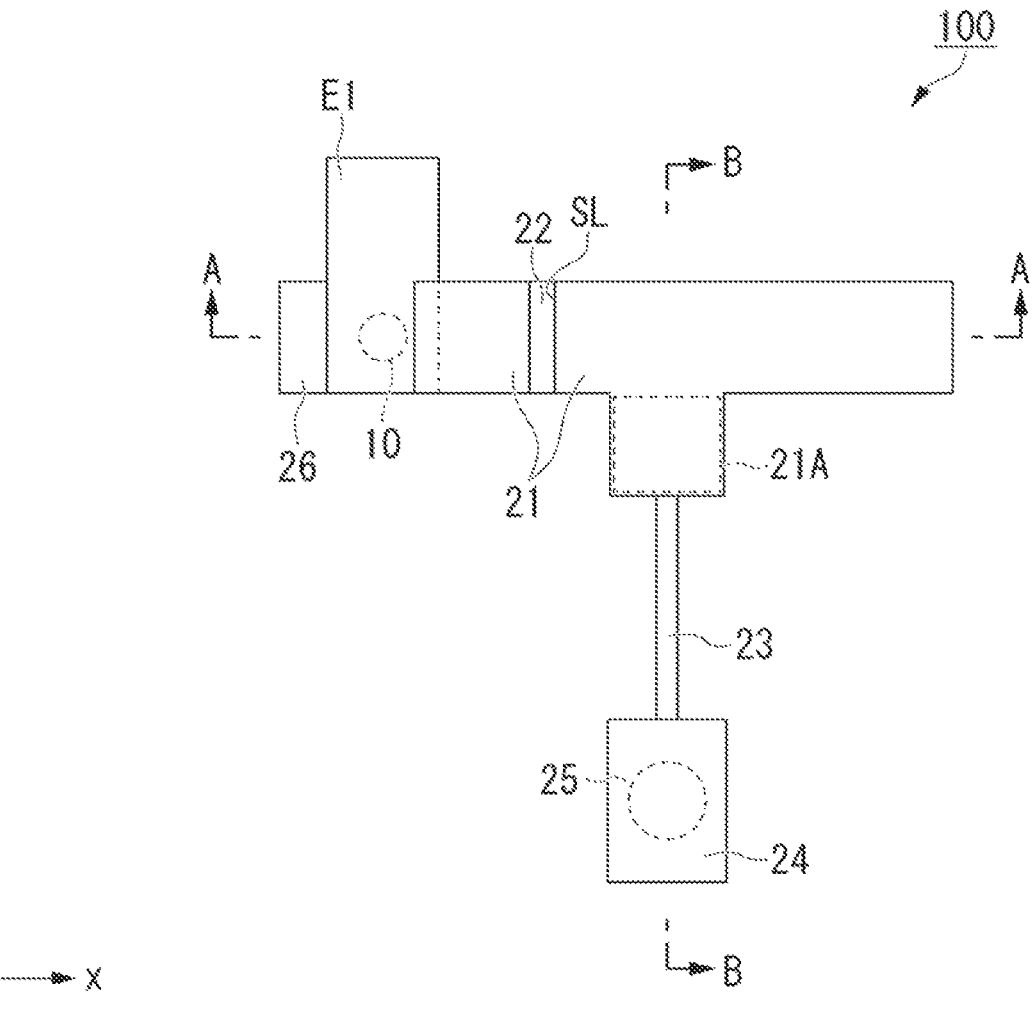
FIG. 3 is a plan view of a feature portion of the light detection element according to the first embodiment.
Figure 4:
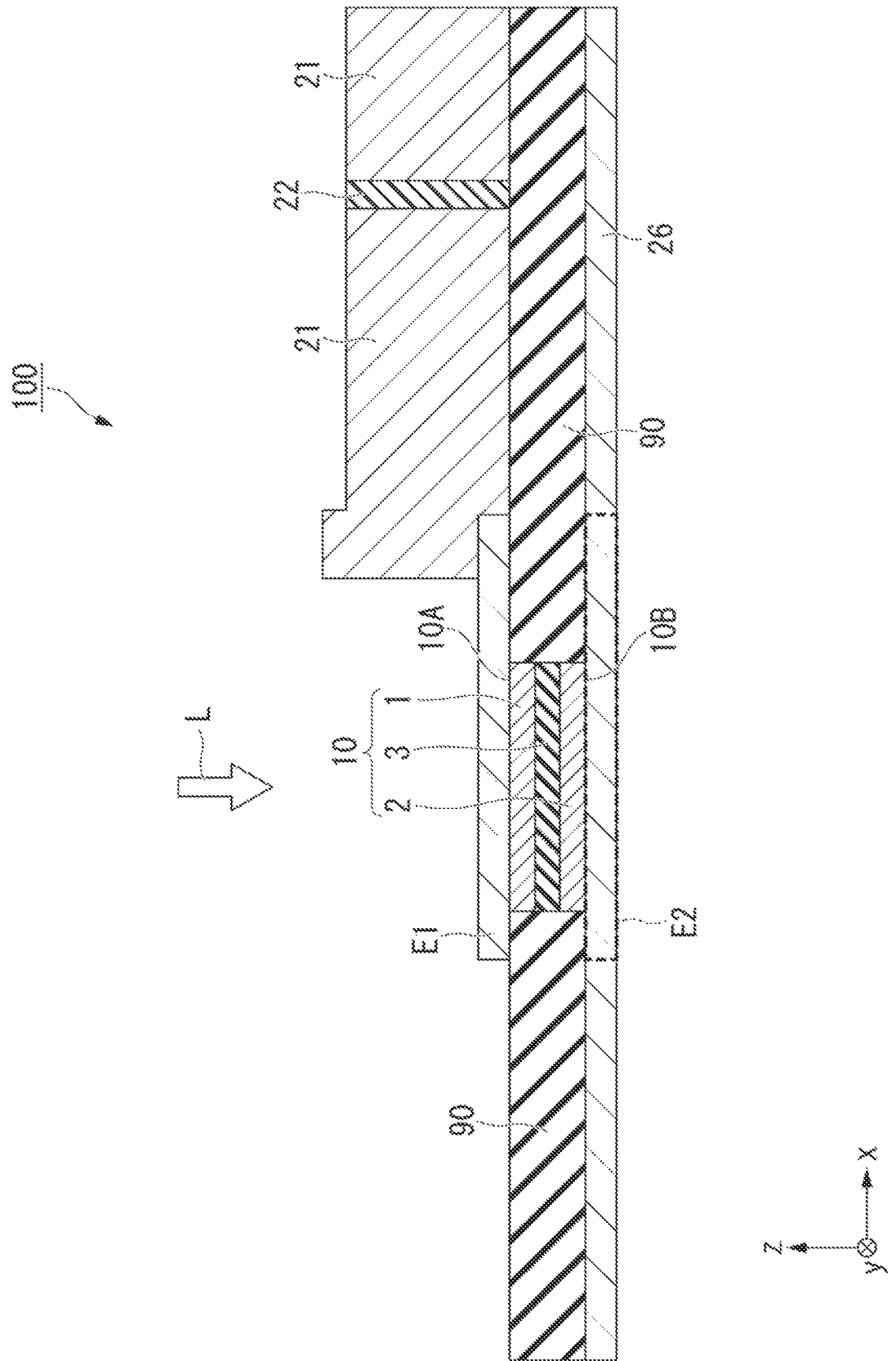
FIG. 4 is a cross-sectional view of the feature portion of the light detection element according to the first embodiment.
Figure 5:
FIG. 5 is a cross-sectional view of the feature portion of the light detection element according to the first embodiment.
Figure 5:
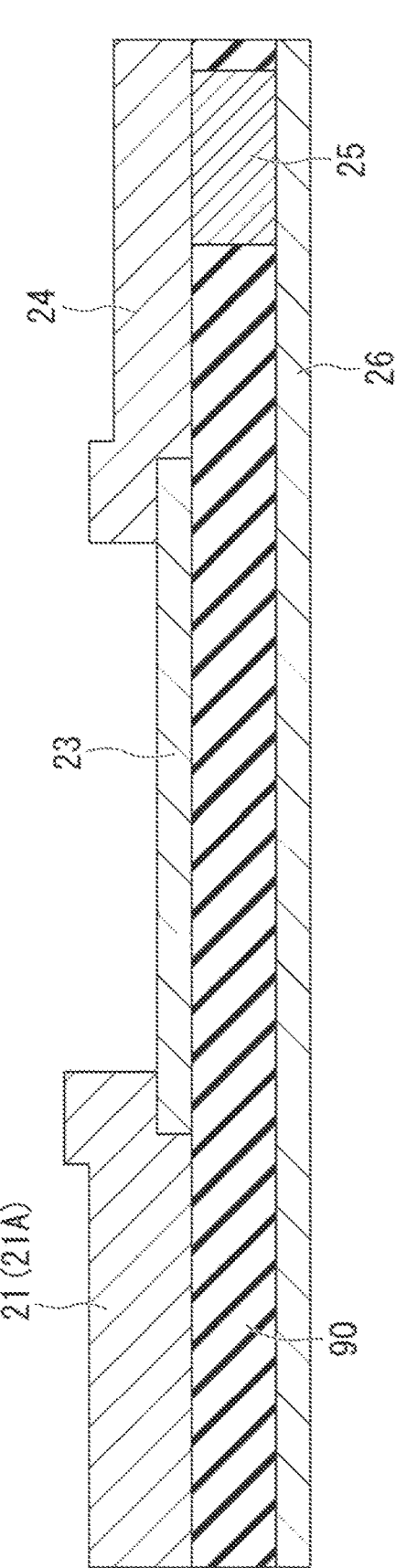
Figure 5:
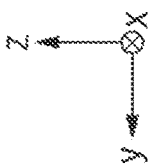

FIG. 3 is a plan view of a feature portion of the light detection element 100 according to the first embodiment. In FIG. 3, a configuration of a part of an insulating layer 90 (to be described below), the lower electrode E2, or the like will be omitted. FIG. 4 and FIG. 5 are cross-sectional views of the feature portion of the light detection element 100 according to the first embodiment. FIG. 4 is a cross-sectional view along line A-A of FIG. 3. FIG. 5 is a cross-sectional view along line B-B of FIG. 3.

The light detection element 100 includes, for example, the magnetic element 10, an upper electrode E1, the lower electrode E2, a first electrode layer 21, a first dielectric body 22, a resistor 23, a connecting electrode 24, a first connecting via 25, a second electrode layer 26, and the insulating layer 90.

In the magnetic element 10, when the intensity of the applied light L changes, the resistance value in the z direction changes according to the change in intensity of the light L. When the resistance value of the magnetic element 10 in the z direction changes, the output voltage from the magnetic element 10 changes. For this reason, when the intensity of the light L applied to the magnetic element 10 changes, the output voltage from the magnetic element 10 changes according to the change in intensity of the light L. The magnetic element 10 has, for example, the first ferromagnetic layer 1, the second ferromagnetic layer 2, and a spacer layer 3. The spacer layer 3 is located between the first ferromagnetic layer 1 and the second ferromagnetic layer 2. The magnetic element 10 may have another layer in addition to these. The magnetic element 10 has a first surface 10A and a second surface 10B facing each other in the z direction. When seen from the spacer layer 3, the first surface 10A is a surface of the magnetic element 10 on the side of the first ferromagnetic layer 1, and the second surface 10B is a surface of the magnetic element 10 on the side of the second ferromagnetic layer 2.

The magnetic element 10 is, for example, a magnetic tunnel junction (MTJ) element in which the spacer layer 3 is constituted by an insulating layer. In the magnetic element 10, the resistance value changes when the light L from the outside is applied. In the magnetic element 10, the resistance value in the z direction (the resistance value when the current flows in the z direction) changes according to a relative change between the state of the magnetization of the first ferromagnetic layer 1 and the state of the magnetization of the second ferromagnetic layer 2. Such an element is also referred to as a magnetoresistance effect element.

The first ferromagnetic layer 1 is a light detection layer in which a state of magnetization changes when light is applied from the outside. The first ferromagnetic layer 1 is also referred to as a magnetization free layer. The magnetization free layer is a layer including a magnetic material in which a state of magnetization changes when energy is applied from a predetermined outside source. The energy from the predetermined outside source is, for example, light applied from the outside, a current flowing in the laminating direction of the magnetic element 10, or an external magnetic field. A state of the magnetization of the first ferromagnetic layer 1 changes according to the intensity of the applied light.

The first ferromagnetic layer 1 includes a ferromagnetic material. The first ferromagnetic layer 1 includes, for example, at least one of magnetic elements such as Co, Fe, Ni, and the like. The first ferromagnetic layer 1 may include a non-magnetic element such as B, Mg, Hf, Gd, or the like together with the above-mentioned magnetic element. The first ferromagnetic layer 1 may be formed of an alloy including, for example, a magnetic element and a non-magnetic element. The first ferromagnetic layer 1 may be constituted by a plurality of layers. The first ferromagnetic layer 1 is, for example, a CoFeB alloy, a laminated body in which a CoFeB alloy layer is sandwiched between Fe layers, or a laminated body in which a CoFeB alloy layer is sandwiched between CoFe layers. In general, "ferromagnetism" includes "ferrimagnetism." The first ferromagnetic layer 1 may show ferrimagnetism. Meanwhile, the first ferromagnetic layer 1 may show ferromagnetism that is not ferrimagnetism. For example, the CoFeB alloy shows ferromagnetism that is not ferrimagnetism.

The first ferromagnetic layer 1 may be an in-plane magnetization film having a magnetization easy axis in a film in-plane direction (in any one xy in-plane direction), or may be a vertical magnetization film having a magnetization easy axis in a film surface-perpendicular direction (z direction).

A film thickness of the first ferromagnetic layer 1 is, for example, 1 nm or more and 5 nm or less. For example, a film thickness of the first ferromagnetic layer 1 may be 1 nm or more and 2 nm or less. When the first ferromagnetic layer 1 is the vertical magnetization film, if the film thickness of the first ferromagnetic layer 1 is small, a vertical magnetic anisotropic applying effect from layers above and below the first ferromagnetic layer 1 is strengthened, and vertical magnetic anisotropy of the first ferromagnetic layer 1 increases. That is, when the vertical magnetic anisotropy of the first ferromagnetic layer 1 is high, a force of magnetization M1 trying to return in the z direction is strengthened. Meanwhile, when the film thickness of the first ferromagnetic layer 1 is great, the vertical magnetic anisotropic applying effect from the layers above and below the first ferromagnetic layer 1 is relatively weakened, and the vertical magnetic anisotropy of the first ferromagnetic layer 1 is weakened.

A volume of the ferromagnetic material decreases when the film thickness of the first ferromagnetic layer 1 decreases, and a volume of the ferromagnetic material increases when the film thickness increases. The ease of the magnetization reaction of the first ferromagnetic layer 1 when energy from the outside is applied is inversely proportional to a product (KuV) of the magnetic anisotropy (Ku) and the volume (V) of the first ferromagnetic layer 1. That is, when the product of the magnetic anisotropy and the volume of the first ferromagnetic layer 1 is smaller, reactivity with respect to the light increases. From this point of view, in order to improve reactivity to the light, the magnetic anisotropy of the first ferromagnetic layer 1 may be appropriately designed; and the volume of the first ferromagnetic layer 1 may be reduced.

When the film thickness of the first ferromagnetic layer 1 is greater than 2 nm, for example, the insertion layer formed of Mo and W may be provided in the first ferromagnetic layer 1. That is, the laminated body obtained by laminating the ferromagnetic layer, the insertion layer and the ferromagnetic layer in the z direction in sequence may be provided as the first ferromagnetic layer 1. The vertical magnetic anisotropy of the entire first ferromagnetic layer 1 increases by the interface magnetic anisotropy in the interface between the insertion layer and the ferromagnetic layer. The film thickness of the insertion layer is, for example, 0.1 nm to 0.6 nm.

The second ferromagnetic layer 2 is a magnetization fixing layer. The magnetization fixing layer is a layer formed of a magnetic material whose state of magnetization is less likely to change than the magnetization free layer when energy from the predetermined outside is applied. For example, in the magnetization fixing layer, an orientation of magnetization is less likely to change than the magnetization free layer when energy from the predetermined outside is applied. In addition, for example, in the magnetization fixing layer, the magnitude of the magnetization is less likely to change than the magnetization free layer when energy from the predetermined outside is applied. A coercive force of the second ferromagnetic layer 2 is, for example, greater than a coercive force of the first ferromagnetic layer 1. The second ferromagnetic layer 2 has, for example, a magnetization easy axis in the same direction as the first ferromagnetic layer 1. The second ferromagnetic layer 2 may be an in-plane magnetization film or may be a vertical magnetization film. A film thickness of the second ferromagnetic layer 2 is, for example, 1 nm or more and 5 nm or less.

A material that forms the second ferromagnetic layer 2 is, for example, the same as the first ferromagnetic layer 1. The second ferromagnetic layer 2 may be a multi-layered film obtained by alternately laminating, for example, Co with a thickness of 0.4 nm to 1.0 nm and Pt with a thickness of 0.4 nm to 1.0 nm a plurality of times. The second ferromagnetic layer 2 may be a laminated body obtained by laminating, for example, Co with a thickness of 0.4 nm to 1.0 nm, Mo with a thickness of 0.1 nm to 0.5 nm, a CoFeB alloy with a thickness of 0.3 nm to 1.0 nm, and Fe with a thickness of 0.3 nm to 1.0 nm in sequence.

The magnetization of the second ferromagnetic layer 2 may be fixed by magnetic coupling to a third ferromagnetic layer via a magnetic coupling layer, for example. In this case, combination of the second ferromagnetic layer 2, the magnetic coupling layer and the third ferromagnetic layer may be referred to as a magnetization fixing layer.

For example, the third ferromagnetic layer is magnetically coupled to the second ferromagnetic layer 2. The magnetic coupling is, for example, anti-ferromagnetical coupling, which occurs due to an RKKY interaction. A material that forms the third ferromagnetic layer is, for example, the same as the first ferromagnetic layer 1. The magnetic coupling layer is formed of, for example, Ru, Ir, or the like.

The spacer layer 3 is a layer disposed between the first ferromagnetic layer 1 and the second ferromagnetic layer 2. The spacer layer 3 is constituted by a layer formed of a conducting material, an insulating material or a semiconductor, or a layer including an electric conduction point formed of a conductor in the insulating material. A film thickness of the spacer layer 3 can be adjusted according to the magnetization of the first ferromagnetic layer 1 and the orientation direction of the magnetization of the second ferromagnetic layer 2 in an initial state, which will be described below.

For example, when the spacer layer 3 is formed of an insulating material, the magnetic element 10 has a magnetic tunnel junction (MTJ) constituted by the first ferromagnetic layer 1, the spacer layer 3 and the second ferromagnetic layer 2. Such an element is referred to as the MTJ element. In this case, the magnetic element 10 can exhibit a tunnel magnetoresistance (TMR) effect. When the spacer layer 3 is formed of a metal, the magnetic element 10 can exhibit a giant magnetoresistance (GMR) effect. Such an element is referred to as a GMR element. While the magnetic element 10 may have different name such as a MTJ element, a GMR element, or the like, depending on a constituent material of the spacer layer 3, it is also generally referred to as a magnetoresistance effect element.

When the spacer layer 3 is constituted by an insulating layer, a material including aluminum oxide, magnesium oxide, titanium oxide, silicon oxide, or the like may be used as a material of the spacer layer 3. In addition, these insulating layers may include an element such as Al, B, Si, Mg, or the like, or a magnetic element such as Co, Fe, Ni, or the like. A high magnetic resistance changing rate is obtained by adjusting the film thickness of the spacer layer 3 such that a high TMR effect is exhibited between the first ferromagnetic layer 1 and the second ferromagnetic layer 2. In order to efficiently use the TMR effect, a film thickness of the spacer layer 3 may be about 0.5 to 5.0 nm or may be about 1.0 to 2.5 nm.

When the spacer layer 3 is formed of a non-magnetic conductive material, a conductive material such as Cu, Ag, Au, Ru, or the like, can be used. In order to efficiently use the GMR effect, a film thickness of the spacer layer 3 may be about 0.5 to 5.0 nm or may be about 2.0 to 3.0 nm.

When the spacer layer 3 is formed of a non-magnetic semiconductor material, a material such as zinc oxide, indium oxide, tin oxide, germanium oxide, gallium oxide, ITO, or the like, can be used. In this case, a film thickness of the spacer layer 3 may be about 1.0 to 4.0 nm.

When a layer including an electric conduction point constituted by a conductor in a non-magnetic insulating material is applied as the spacer layer 3, a structure including the electric conduction point constituted by the non-magnetic conductor such as Cu, Au, Al, or the like, in the non-magnetic insulating material formed of aluminum oxide or magnesium oxide may be provided. In addition, the conductor may be constituted by a magnetic element such as Co, Fe, Ni, or the like. In this case, a film thickness of the spacer layer 3 may be about 1.0 to 2.5 nm. The electric conduction point is, for example, a columnar body with a diameter of 1 nm or more and 5 nm or less when seen in a direction perpendicular to the film surface.

The magnetic element 10 may have a underlying layer, a cap layer, a vertical magnetization induction layer, and the like, in addition to this. The underlying layer is located between the second ferromagnetic layer 2 and the lower electrode E2. The underlying layer is a seed layer or a buffer layer.

The buffer layer is a layer that attenuates a lattice mismatch between different crystals. The buffer layer is formed of, for example, a metal including at least one element selected from the group consisting of Ta, Ti, Zr and Cr, or a nitride including at least one element selected from the group consisting of Ta, Ti, Zr and Cu. More specifically, the buffer layer is formed of, for example, Ta (simple substance), NiCr alloy, TaN (tantalum nitride), CuN (copper nitride), or the like. A film thickness of the buffer layer is, for example, 1 nm or more and 5 nm or less. The buffer layer is, for example, amorphous. The buffer layer is located, for example, between the seed layer and the lower electrode E2, and comes into contact with the lower electrode E2. The buffer layer suppresses the crystal structure of the lower electrode E2 from affecting the crystal structure of the second ferromagnetic layer 2.

The seed layer increases crystallinity of a layer laminated on the seed layer. The seed layer is located, for example, on the buffer layer. The seed layer is formed of, for example Pt, Ru, Hf, Zr, or NiFeCr. A film thickness of the seed layer is, for example, 1 nm or more and 5 nm or less.

The cap layer is located between the first ferromagnetic layer 1 and the upper electrode E1. The cap layer prevents damages to the lower layer in a treatment process and increases crystallinity of the lower layer during annealing. A film thickness of the cap layer is, for example, 3 nm or less such that a sufficient amount of light is applied to the first ferromagnetic layer 1. The cap layer is, for example, MgO, W, Mo, Ru, Ta, Cu, Cr, a laminated film thereof, or the like.

The vertical magnetization induction layer is formed when the first ferromagnetic layer 1 is the vertical magnetization film. The vertical magnetization induction layer is laminated on the first ferromagnetic layer 1. The vertical magnetization induction layer induces the vertical magnetic anisotropy of the first ferromagnetic layer 1. The vertical magnetization induction layer is formed of, for example, magnesium oxide, W, Ta, Mo. or the like. When the vertical magnetization induction layer is formed of the magnesium oxide, in order to increase conductivity, the magnesium oxide may be oxygen deficient. A film thickness of the vertical magnetization induction layer is, for example, 0.5 nm or more and 2.0 nm or less.

The light L is applied to the magnetic element 10 from the side of the first surface 10A. The upper electrode E1 is disposed, for example, on the side of the first surface 10A of the magnetic element 10. The light L is applied to the magnetic element 10 from the side of the upper electrode E1, and applied to at least the first ferromagnetic layer 1. For example, the upper electrode E1 comes into contact with the first surface 10A of the magnetic element 10. The upper electrode E1 comes into contact with the first electrode layer 21. The upper electrode E1 and the first electrode layer 21 may be integrated. The upper electrode E1 is connected to the power supply 80 via the first terminal p1.

The upper electrode E1 is formed of a conductive material. The upper electrode E1 is, for example, a transparent electrode having permeability with respect to light of a use wavelength band. For example, the upper electrode E1 may transmit 80% or more of the light of the use wavelength band. The upper electrode E1 is formed of an oxide such as indium tin oxide (ITO), indium zinc oxide (IZO), zinc oxide (ZnO), indium gallium zinc oxide (IGZO), or the like. The upper electrode E1 may have a configuration having a plurality of columnar metals in the transparent electrode material of these oxides. It is not essential to use the above-mentioned transparent electrode material as the upper electrode E1, and the applied light may reach the first ferromagnetic layer 1 by using the metal material such as Au, Cu, Al, or the lie, with a small film thickness. When the metal is used as the material of the upper electrode E1, a film thickness of the upper electrode E1 is, for example, 3 to 10 nm. In addition, the upper electrode E1 may have an antireflection film on an irradiation surface to which light is applied.

The lower electrode E2 is located opposite to the upper electrode E1 with the magnetic element 10 sandwiched therebetween. For example, the lower electrode E2 comes into contact with the second surface 10B of the magnetic element 10. The lower electrode E2 comes into contact with the second electrode layer 26. As shown in FIG. 4, the lower electrode E2 may be a part of the second electrode layer 26.

The lower electrode E2 is formed of a conductive material. The lower electrode E2 is formed of a metal such as Cu, Al, Au, or the like. Ta or Ti may be laminated above and below these metals. In addition, a laminated film of Cu and Ta, a laminated film of Ta, Cu and Ti, or a laminated film of Ta, Cu and TaN may be used. In addition, as the lower electrode E2, TiN or TaN may be used. A film thickness of the lower electrode E2 is, for example, 200 nm to 800 nm. The lower electrode E2 may have permeability with respect to the light applied to the magnetic element 10. As the material of the lower electrode E2, like the upper electrode E1, for example, a transparent electrode material of an oxide such as indium tin oxide (ITO), indium zinc oxide (IZO), zinc oxide (ZnO), indium gallium zinc oxide (IGZO), or the like, may be used. Even when the light is applied from the side of the upper electrode E1, while the light may reach the lower electrode E2 depending on the intensity of light, in this case, since the lower electrode E2 is formed of a transparent electrode material of an oxide, in comparison with the case in which the lower electrode E2 is formed of a metal, reflection of the light in the interface between the lower electrode E2 and the layer adjacent thereto can be suppressed.

The first electrode layer 21 is electrically connected to the first surface 10A of the magnetic element 10. For example, as shown in FIG. 4, the first electrode layer 21 is electrically connected to the first surface 10A via the upper electrode E1. For example, as shown in FIGS. 4 and 5, the first electrode layer 21 is disposed such that a position in the z direction is closer to the first surface 10A than the magnetic element 10 (a side in the +z direction). The first electrode layer 21 is formed of a conductive material. The first electrode layer 21 is composed of a material such as Cu, Al, Au, or the like. In addition, the first electrode layer 21 is an electrode configured to output an output voltage of the circuit 20, which is connected to the signal processing unit 110 via the second terminal p2.

The first electrode layer 21 has a slit SL. When seen in a plan view in the z direction, a longitudinal direction of the slit SL is a direction crossing a line segment that connects the magnetic element 10 and the second terminal p2. The inside of the slit SL is filled with the first dielectric body 22. The first dielectric body 22 is formed of, for example, oxide, nitride, or oxynitride of Si, Al, or Mg. The first dielectric body 22 is formed of, for example, silicon oxide ($SiO_x$), silicon nitride ($SiN_x$), silicon carbide (SiC), chrome nitride (CrN), silicon carbon nitride (SiCN), silicon oxynitride (SiON), aluminum oxide ($Al_2O_3$), zirconium oxide ($ZrO_x$), or the like.

The first dielectric body 22 and the first electrode layer 21 constitute at least a part of the capacitor C shown in FIG. 2. The first electrode layer 21 that sandwiches the slit SL corresponds to a polar plate of the capacitor C, and the first dielectric body 22 corresponds to a dielectric body between polar plates. For example, when a silicon oxide with a relative dielectric constant of 3.8 is used as a material of the first dielectric body 22, a thickness of the first electrode layer 21 in the z direction is 0.8 μm, a width in the y direction is 5 μm, and a width of the slit SL in the x direction is 0.1 μm, a capacitance value of the capacitor C can be set to 0.001 pF.

The first electrode layer 21 has, for example, a connecting part 21A between the magnetic element 10 (an upper electrode 1E) and the second terminal p2. The connecting part 21A is a portion where the resistor 23 is connected to the first electrode layer 21. For example, the connecting part 21A is provided to protrude in a direction crossing a line segment that connects the magnetic element 10 and the second terminal p2 when seen in a plan view in the z direction. The slit SL is located, for example, between the magnetic element 10 and the connecting part 21A.

The resistor 23 constitutes the resistor R of FIG. 2. The resistor 23 is branched off from the first electrode layer 21 and connected to the first electrode layer 21 at the connecting part 21A. The resistor 23 is located between the connecting part 21A of the first electrode layer 21 and the first connecting via 25. The resistor 23 connects, for example, the connecting part 21A and the connecting electrode 24, and electrically connects the first electrode layer 21 and the first connecting via 25. The resistor 23 can be designed with a material, a cross-sectional area, or the like, according to the required resistance value. The resistor 23 can be used as a metal such as NiCr alloy, Ta, Ti, TaN, $Ta_2N$, TiN, ZrN, $SnO_2$, CrSiO, $RuO_2$, or the like, or a material such as metal nitride or metal oxide. For example, when NiCr alloy with volume resistivity of 1 μΩm is used as a material of the resistor 23, a thickness of the resistor 23 in the z direction is 0.01 μm, and a width in the x direction is 1 μm, a length in the y direction is 10 μm, a resistance value of the resistor 23 can be set to 1000Ω.

The connecting electrode 24 connects the resistor 23 and the first connecting via 25. The connecting electrode 24 may be eliminated, and the resistor 23 may be directly connected to the first connecting via 25. The same material as the material exemplified in the first electrode layer 21 can be used in the connecting electrode 24.

The first connecting via 25 passes through the insulating layer 90 in the z direction. The first connecting via 25 electrically connects the resistor 23 and the second electrode layer 26. The first connecting via 25 connects, for example, the connecting electrode 24 and the second electrode layer 26. The same material as the material exemplified in the first electrode layer 21 can be used in the first connecting via 25.

The second electrode layer 26 is electrically connected to the second surface 10B of the magnetic element 10 and the first connecting via 25. For example, as shown in FIGS. 4 and 5, the second electrode layer 26 is disposed such that a position in the z direction is closer to the second surface 10B than the magnetic element 10 (the side in the −z direction). The second electrode layer 26 is electrically connected to the first electrode layer 21 via the first connecting via 25 and the resistor 23. The second electrode layer 26 is connected to a reference potential, for example, grounded. The second electrode layer 26 has a shape expanding along, for example, a xy plane. The same material as the material exemplified in the first electrode layer 21 can be used in the second electrode layer 26.

The insulating layer 90 is formed of an insulating material that insulates between wirings of a multi-layered wiring or between elements. The insulating layer 90 covers surroundings of the magnetic element 10. The insulating layer 90 is formed of, for example, oxide, nitride, or oxynitride of Si, Al or Mg. The insulating layer 90 is formed of, for example, silicon oxide ($SiO_x$), silicon nitride ($SiN_x$), silicon carbide (SiC), chrome nitride (CrN), silicon carbon nitride (SiCN), silicon oxynitride (SiON), aluminum oxide ($Al_2O_3$), zirconium oxide ($ZrO_x$), or the like.

Next, an operation of the light detection element 100 according to the first embodiment will be described. The light L including an optical signal with a change of intensity of the light is applied to the first ferromagnetic layer 1 of the magnetic element 10. The optical signal included in the light L has at least two levels of intensity. A lens may be disposed on one side of the first ferromagnetic layer 1 in the laminating direction of the magnetic element 10, and the light condensed to the first ferromagnetic layer 1 may be applied via the lens.

A resistance value of the magnetic element 10 in the z direction changes according to the irradiation of the light L including the optical signal to the first ferromagnetic layer 1. A case in which the intensity of light applied to the first ferromagnetic layer 1 has two levels of first intensity and second intensity greater than the first intensity will be described. The second intensity is greater than the first intensity. The first intensity may be a case in which the intensity of light applied to the first ferromagnetic layer 1 is zero.

Figure 6:
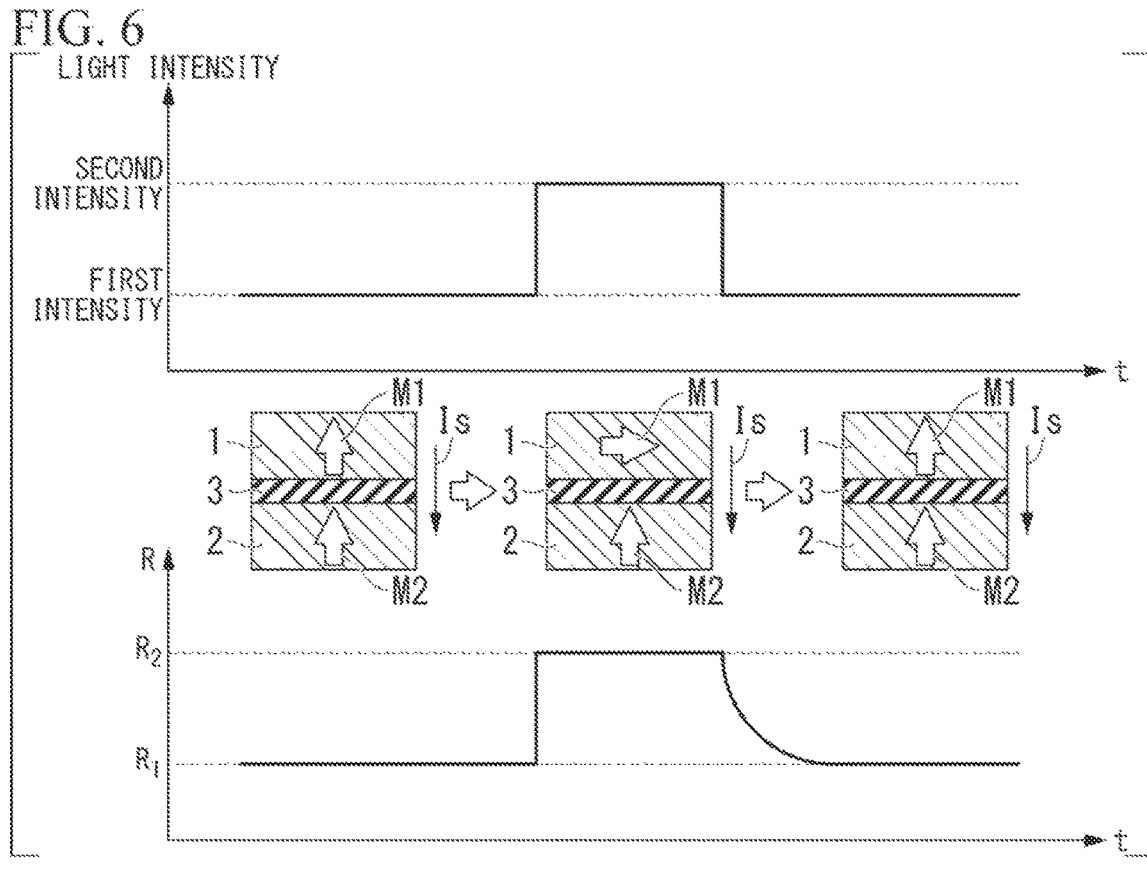
FIG. 6 is a view for describing a first mechanism of a first operation example of a magnetic element according to the first embodiment.
Figure 7:
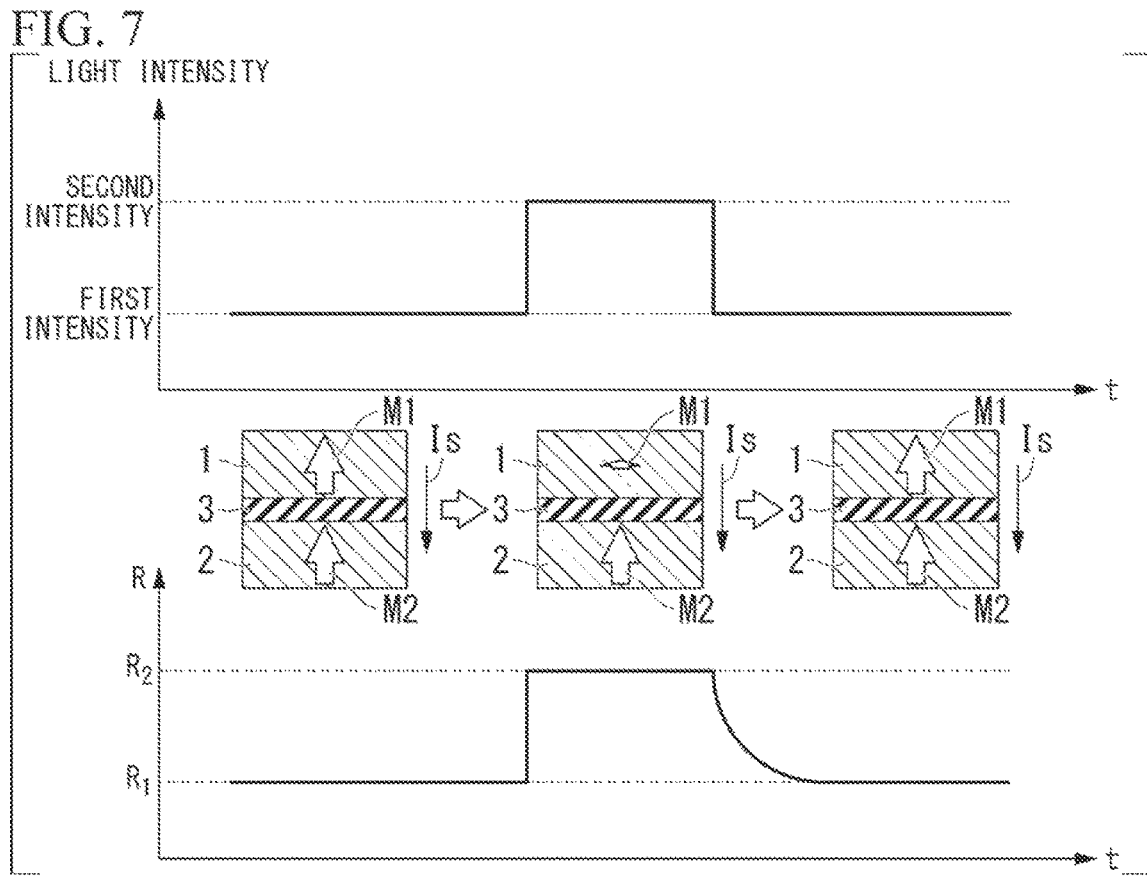
FIG. 7 is a view for describing a second mechanism of the first operation example of the magnetic element according to the first embodiment.

FIG. 6 and FIG. 7 are views for describing a first operation example of the magnetic element 10. FIG. 6 is a view for describing a first mechanism of the first operation example, and FIG. 7 is a view for describing a second mechanism of the first operation example. In each upper graph in FIG. 6 and FIG. 7, a longitudinal axis indicates intensity of light applied to the first ferromagnetic layer 1, and a lateral axis indicates time. In each lower graph in FIG. 6 and FIG. 7, a longitudinal axis indicates a resistance value of the magnetic element 10 in the z direction, and a lateral axis indicates time.

First, in a state in which the light with the first intensity is continuously applied to the first ferromagnetic layer 1 for a sufficient time (hereinafter, referred to as an initial state), the magnetization M1 of the first ferromagnetic layer 1 and the magnetization M2 of the second ferromagnetic layer 2 have a parallel relation, a resistance value of the magnetic element 10 in the z direction shows a first resistance value R1, and a magnitude of the output voltage from the magnetic element 10 shows a first value. The resistance value of the magnetic element 10 in the z direction is obtained using Ohm's law from values of voltages generated on both ends of the magnetic element 10 in the z direction by flowing the sense current Is through the magnetic element 10 in the z direction. The output voltage from the magnetic element 10 is generated between the upper electrode E1 and the lower electrode E2.

In the case of the example shown in FIG. 6, the sense current Is flows from the first ferromagnetic layer 1 toward the second ferromagnetic layer 2. As the sense current Is flows in the direction, a spin transfer torque in the same direction as the magnetization M2 of the second ferromagnetic layer 2 is applied to the magnetization M1 of the first ferromagnetic layer 1, and the magnetization M1 and the magnetization M2 are in parallel in the initial state. In the example shown in FIG. 6, in the initial state, both the direction of the magnetization M1 and the direction of the magnetization M2 are in the +z direction. In addition, it is possible to prevent the magnetization M1 of the first ferromagnetic layer 1 from being reversed during operation by flowing the sense current Is in the direction.

Next, the intensity of the light applied to the first ferromagnetic layer 1 changes from the first intensity to the second intensity. The second intensity is greater than the first intensity, and the magnetization M1 of the first ferromagnetic layer 1 changes from the initial state. The state of the magnetization M1 of the first ferromagnetic layer 1 in a state in which the light is not applied to the first ferromagnetic layer 1 is different from the state of the magnetization M1 of the first ferromagnetic layer 1 in a state in which the light with the second intensity is applied to the first ferromagnetic layer 1. The state of the magnetization M1 is, for example, the inclination angle in the z direction, the magnitude thereof, or the like.

For example, as shown in FIG. 6, when the intensity of the light applied to the first ferromagnetic layer 1 changes from first intensity to the second intensity, the magnetization M1 is inclined in the z direction. In addition, for example, as shown in FIG. 7, when the intensity of the light applied to the first ferromagnetic layer 1 changes from the first intensity to the second intensity, the magnitude of the magnetization M1 decreases. For example, when the magnetization M1 of the first ferromagnetic layer 1 is inclined in the z direction according to the irradiation intensity of the light, the inclination angle is greater than 0° and smaller than 90°.

When the magnetization M1 of the first ferromagnetic layer 1 changes from the initial state, the resistance value of the magnetic element 10 in the z direction shows a second resistance value R2, a magnitude of the output voltage from the magnetic element 10 shows a second value. The second resistance value R2 is greater than the first resistance value R1, and the second value of the output voltage is greater than the first value. The second resistance value R2 is between the resistance value (the first resistance value R1) when the magnetization M1 and the magnetization M2 are parallel and the resistance value when the magnetization M1 and the magnetization M2 are antiparallel.

In the case shown in FIG. 6, a spin transfer torque in the same direction as the magnetization M2 of the second ferromagnetic layer 2 is applied to the magnetization M1 of the first ferromagnetic layer 1. Accordingly, the magnetization M1 tends to return to a parallel state with the magnetization M2, and when the intensity of the light applied to the first ferromagnetic layer 1 changes from the second intensity to the first intensity, the magnetization M1 returns to the parallel state with the magnetization M2. In the case shown in FIG. 7, when the intensity of the light applied to the first ferromagnetic layer 1 returns to the first intensity, the magnitude of the magnetization M1 of the first ferromagnetic layer 1 returns to the magnitude in the initial state. In both cases, the resistance value of the magnetic element 10 in the z direction returns to the first resistance value R1. That is, when the intensity of the light applied to the first ferromagnetic layer 1 changes from the second intensity to the first intensity, the resistance value of the magnetic element 10 in the z direction changes from the second resistance value R2 to the first resistance value R1, and the magnitude of the output voltage from the magnetic element 10 changes from the second value to the first value.

The output voltage from the magnetic element 10 can be changed to correspond to the change in intensity of the light applied to the first ferromagnetic layer 1, and the change in intensity of the applied light can be converted into the change in output voltage from the magnetic element 10. That is, the magnetic element 10 can replace the light with the electric signal.

Figure 9:
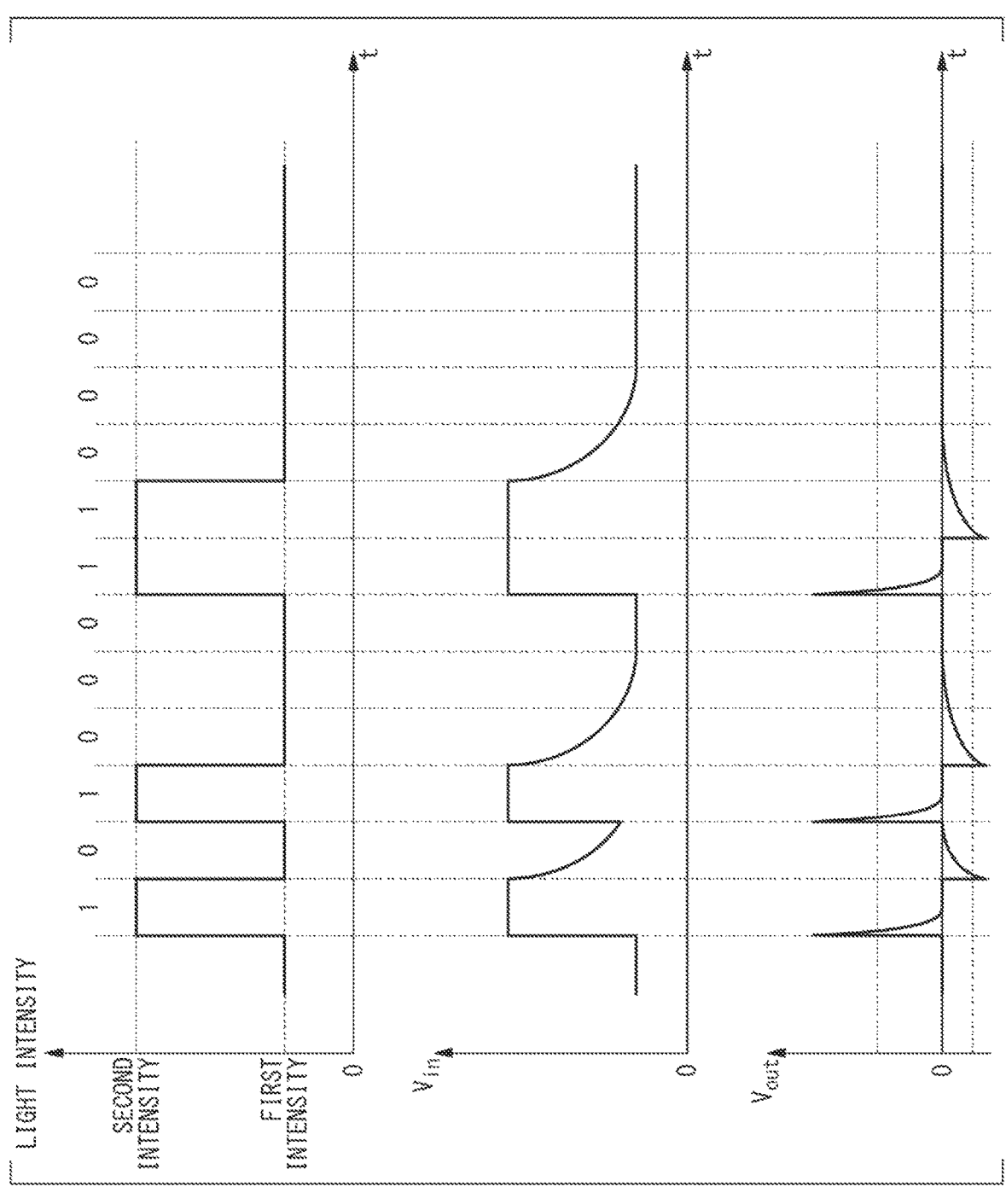
FIG. 9 shows a relation between a time change of an input voltage to the circuit according to the first embodiment and a time change of an output voltage from the light detection element according to the first embodiment.

As shown in FIGS. 6 and 7 and FIG. 9, which will be described below, in the first operation example, when the intensity of the light applied to the first ferromagnetic layer 1 changes from the second intensity to the first intensity, the resistance value of the magnetic element 10 in the z direction changes from the second resistance value R2 to the first resistance value R1. The inventor(s) has found out that the resistance value of the magnetic element 10 in the z direction changes from the first resistance value R1 to the second resistance value R2, and the time required when the magnitude of the output voltage from the magnetic element 10 changes from the second value to the first value is longer than the time required when the intensity of the light applied to the first ferromagnetic layer 1 changes from the first intensity to the second intensity. The inventor(s) has considered that the change in the state of the magnetization M1 due to the irradiation of the light to the first ferromagnetic layer 1 is caused by generation of electronic heat due to irradiation of the light. In addition, the inventor(s) believes that, when the intensity of the light applied to the first ferromagnetic layer 1 decreases, it takes time for thermal relaxation of lattice heat and it takes time for the change in state of the magnetization M1.

Here, while the case in which the magnetization M1 and the magnetization M2 are parallel in the initial state has been exemplarily described, the magnetization M1 and the magnetization M2 may be antiparallel in the initial state. In this case, the resistance value of the magnetic element 10 in the z direction decreases as the state of the magnetization M1 changes (for example, as the change in angle from the initial state of the magnetization M1 increases). When the magnetization M1 and the magnetization M2 are antiparallel in the initial state, the sense current Is may flow from the second ferromagnetic layer 2 toward the first ferromagnetic layer 1. As the sense current Is flows in the direction, the spin transfer torque in the direction opposite to the magnetization M2 of the second ferromagnetic layer 2 is applied to the magnetization M1 of the first ferromagnetic layer 1, and the magnetization M1 and the magnetization M2 are antiparallel in the initial state.

The light L including the optical signal applied to the first ferromagnetic layer 1 is converted into the electric signal by the magnetic element 10 and input to the circuit 20.

Figure 8:
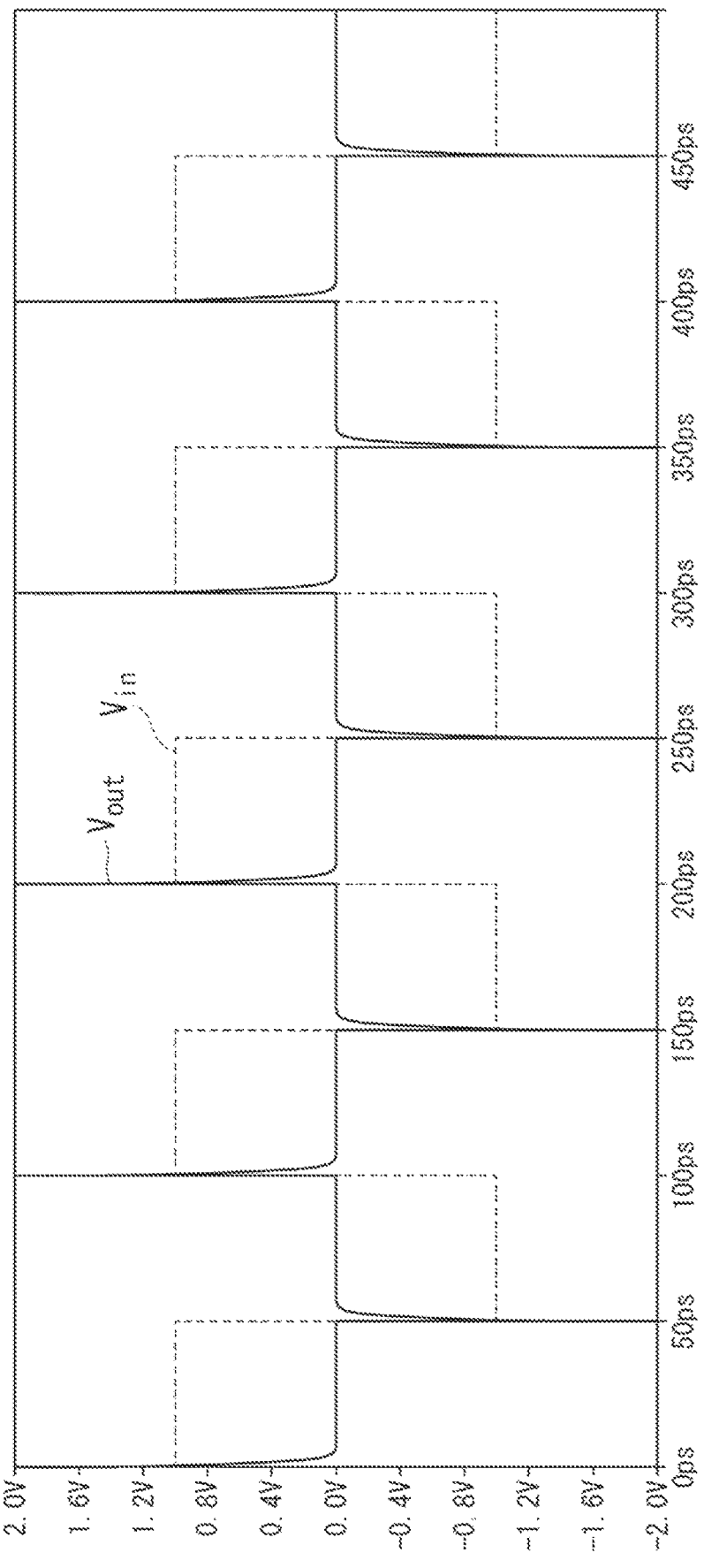
FIG. 8 is a graph showing a time change of an input voltage input to a CR circuit and an output voltage from the CR circuit.

FIG. 8 is a graph showing a time change of an input voltage $V_{in}$ input to the CR circuit and an output voltage $V_{out}$ from the CR circuit. In FIG. 8, a resistance value of the resistor R of the CR circuit is 1000Ω, a capacity value of the capacitor C is 0.001 pF, and a frequency of the input voltage $V_{in}$ is 10 GHz. As shown in FIG. 8, the output voltage $V_{out}$ corresponds to a portion with a large absolute value of an amount of change per unit time of the input voltage $V_{in}$ to indicate a large value of the absolute value, and corresponds to a portion with a small absolute value of the amount of change per unit time of the input voltage $V_{in}$ (in the example of FIG. 8, a portion with a amount of change of zero per unit time) to indicate a small value of the absolute value. That is, the CR circuit outputs the voltage corresponding to the amount of change per unit time of the input voltage $V_{in}$ as the output voltage $V_{out}$ substantially like the differential circuit by adjusting the capacity value of the capacitor C and the resistance value of the resistor R. In the CR circuit, the product of the capacity value of the capacitor C and the resistance value of the resistor R is a time constant, and an aspect of the time change of the output voltage $V_{out}$ with respect to the time change of the input voltage $V_{in}$ changes according to the value of the time constant. The time constant is set according to, for example, a frequency of the input voltage $V_{in}$. For example, the capacity value of the capacitor C and the resistance value of the resistor R are set such that the time constant is smaller than a half of a cycle that is a reciprocal number of the frequency of the input voltage $V_{in}$. In the example of FIG. 8, the time constant is 0.001 (pF)×1000 (Ω)=1 (ps), which is smaller than 50 ps that is a length of a half cycle of the input voltage $V_{in}$.

The circuit 20 in the light detection element 100 according to the first embodiment is the CR circuit. That is, the input voltage $V_{in}$ shown in FIG. 8 corresponds to the output voltage from the magnetic element 10, and the output voltage $V_{out}$ shown in FIG. 8 corresponds to the output voltage from the circuit 20 (the output voltage from the light detection element 100).

FIG. 9 shows a relation between a time change of intensity of light applied to the magnetic element 10 in the first operation example of the magnetic element 10, a time change of the input voltage $V_{in}$ to the circuit 20 (the output voltage from the magnetic element 10), and a time change of the output voltage from the circuit 20. The uppermost view of FIG. 9 shows a time change of the intensity of the light applied to the magnetic element 10. A second view from the top of FIG. 9 shows a time change of the output voltage from the magnetic element 10. The lowermost view of FIG. 9 shows a time change of the output voltage from the circuit 20.

As shown in FIG. 9, when the input voltage $V_{in}$ to the circuit 20 (the output voltage from the magnetic element 10)

increases, the output voltage $V_{out}$ from the circuit 20 shows a large positive value, and when the input voltage $V_{in}$ to the circuit 20 (the output voltage from the magnetic element 10) decreases, the output voltage $V_{out}$ from the circuit 20 shows a large negative value of the absolute value.

For this reason, for example, the receiving device 200 determines switching from the first signal (for example, "1") to the second signal (for example, "0") when the output voltage from the circuit 20 exceeds a threshold, determines switching from the second signal (for example, "0") to the first signal (for example, "1") when the output voltage from the circuit 20 is smaller than the threshold, and determines that it is the same signal as the previous signal when the output voltage from the circuit 20 is within a range of the threshold (as it is the first signal (for example, "1") or as it is the second signal (for example, "0")). In addition, the receiving device 200 obtains the absolute value of the output voltage from the circuit 20, and thus, can determine that the intensity of the light L changes when the absolute value of the output voltage is equal to or greater than the threshold and determine that the intensity of the light L is not changed when the absolute value of the output voltage is less than the threshold.

While the example of the operation of the light detection element 100 has been shown so far, the operation of the light detection element 100 is not limited to the example.

Figure 10:
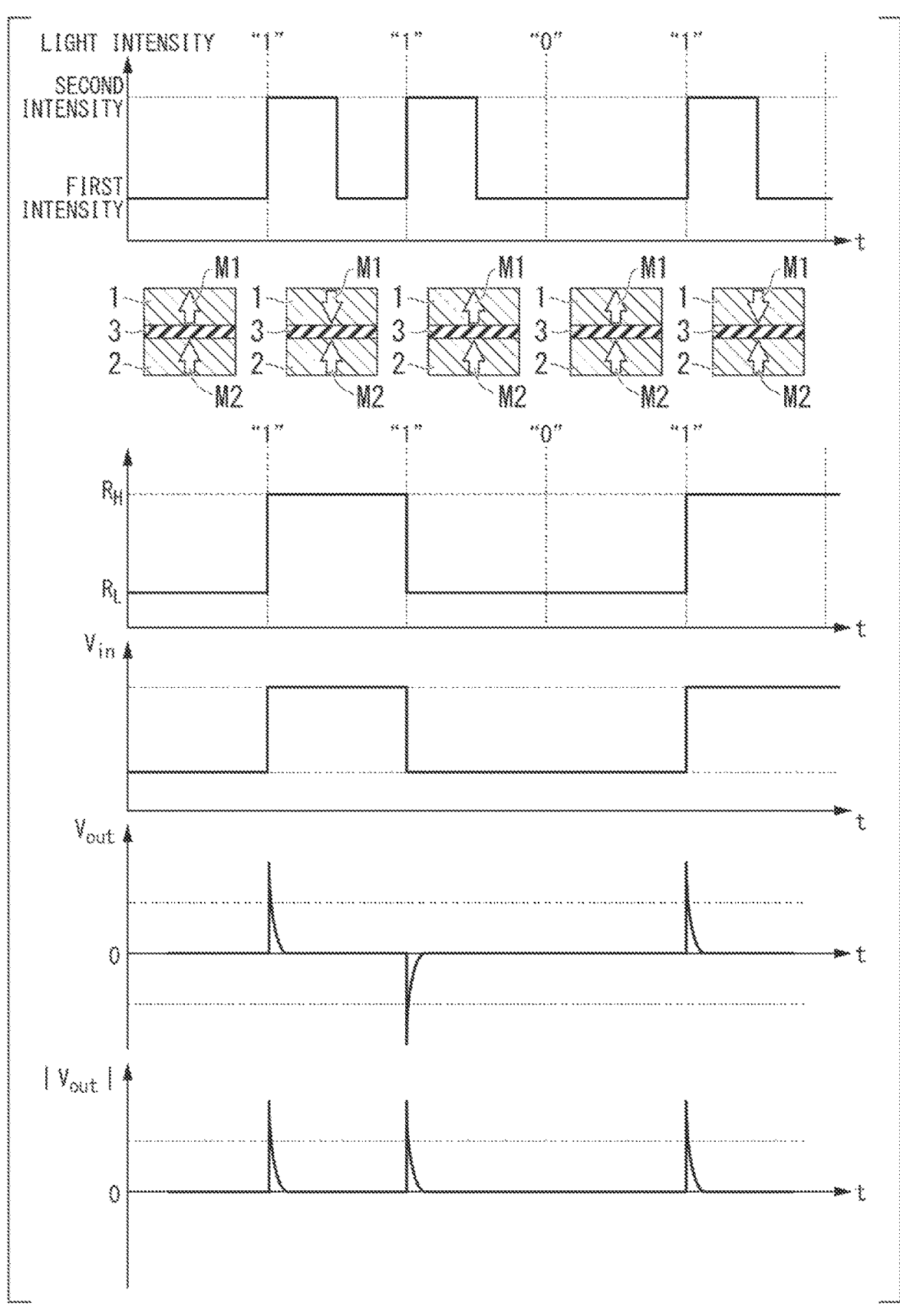
FIG. 10 is a view for describing a second operation example of the magnetic element according to the first embodiment.

FIG. 10 is a view for describing a second operation example of the magnetic element 10 according to the first embodiment. In the uppermost graph of FIG. 10, a longitudinal axis indicates intensity of light applied to the first ferromagnetic layer 1, and a lateral axis indicates time. In a second graph from the top of FIG. 10, a longitudinal axis indicates a resistance value of the magnetic element 10 in the z direction, and a lateral axis indicates time. In a third graph from the top of FIG. 10, a longitudinal axis indicates the input voltage $V_{in}$ to the circuit 20 (the output voltage from the magnetic element 10), and a lateral axis indicates time. In a fourth graph from the top of FIG. 10, a longitudinal axis indicates the output voltage $V_{out}$ from the circuit 20, and a lateral axis indicates time. In a fifth graph from the top of FIG. 10, a longitudinal axis indicates an absolute value $|V_{out}|$ of the output voltage from the circuit 20, and a lateral axis indicates time.

In the second operation example, the change of the output voltage from the magnetic element 10 (the resistance value of the magnetic element 10 in the z direction) within a predetermined time is processed as the first signal (for example, "1"), and no change of the output voltage from the magnetic element 10 (the resistance value of the magnetic element 10 in the z direction) within the predetermined time is processes as the second signal (for example, "0"). The predetermined time is determined according to a modulation frequency of the optical signal.

First, the optical signal applied to the magnetic element 10 is defined. In the optical signal, the case in which the intensity of the light applied to the first ferromagnetic layer 1 changes from the first intensity to the second intensity is set as the first signal (for example, "1"), and the intensity of the light applied to the first ferromagnetic layer 1 is maintained at the first intensity over the predetermined time is set as the second signal (for example, "0"). The intensity of the light changed from the first intensity to the second intensity returns to the first intensity after a constant time elapses.

The optical signal is applied to the first ferromagnetic layer 1 of the magnetic element 10. When the intensity of the light applied to the first ferromagnetic layer 1 changes from the first intensity to the second intensity, the magnetization M1 of the first ferromagnetic layer 1 is reversed. Further, when the intensity of the light applies to the first ferromagnetic layer 1 returns from the second intensity to the first intensity, the magnetization M1 of the first ferromagnetic layer 1 is not reversed. The resistance value of the magnetic element 10 in the z direction is changed from a low resistance $R_L$ to a high resistance $R_H$ or from the high resistance $R_H$ to the low resistance $R_L$ when the intensity of the light applied to the first ferromagnetic layer 1 changes from the first intensity to the second intensity. That is, when the intensity of the light applied to the first ferromagnetic layer 1 changes from the first intensity to the second intensity, regardless of whether the magnetization M1 of the first ferromagnetic layer 1 and the magnetization M2 of the second ferromagnetic layer 2 are parallel or antiparallel, in either case, the resistance value of the magnetic element 10, i.e., the output voltage from the magnetic element 10 changes. That is, when the information of the first signal (for example, "1") is input as the optical signal, the output voltage from the magnetic element 10 (the resistance value of the magnetic element 10) changes.

On the other hand, when the light is not applied to the first ferromagnetic layer 1 of the magnetic element 10 or the intensity of the applied light is small, the magnetization M1 of the first ferromagnetic layer 1 maintains its state. For this reason, when the intensity of the light applied to the first ferromagnetic layer 1 is maintained at the first intensity over the predetermined time, the resistance value of the magnetic element 10 in the z direction, i.e., the output voltage from the magnetic element 10 is not changed. That is, when information of the second signal (for example, "0") is input as the optical signal, the output voltage from the magnetic element 10 (the resistance value of the magnetic element 10) is not changed.

The output voltage from the magnetic element 10 is input to the circuit 20. When the output voltage from the magnetic element 10 increases, the output voltage $V_{out}$ of the light detection element 100 indicates a large positive value, and when the output voltage of the magnetic element 10 decreases, the output voltage $V_{out}$ of the light detection element 100 indicates a large negative value of the absolute value.

For this reason, for example, the receiving device 200 can determine that the case in which the absolute value $|V_{out}|$ of the output voltage $V_{out}$ from the circuit 20 exceeds a threshold is set as the first signal (for example, "1"), and can determine that the case in which the absolute value $|V_{out}|$ of the output voltage $V_{out}$ from the circuit 20 is smaller than the threshold over the predetermined time is set as the second signal (for example, "0").

Figure 11:
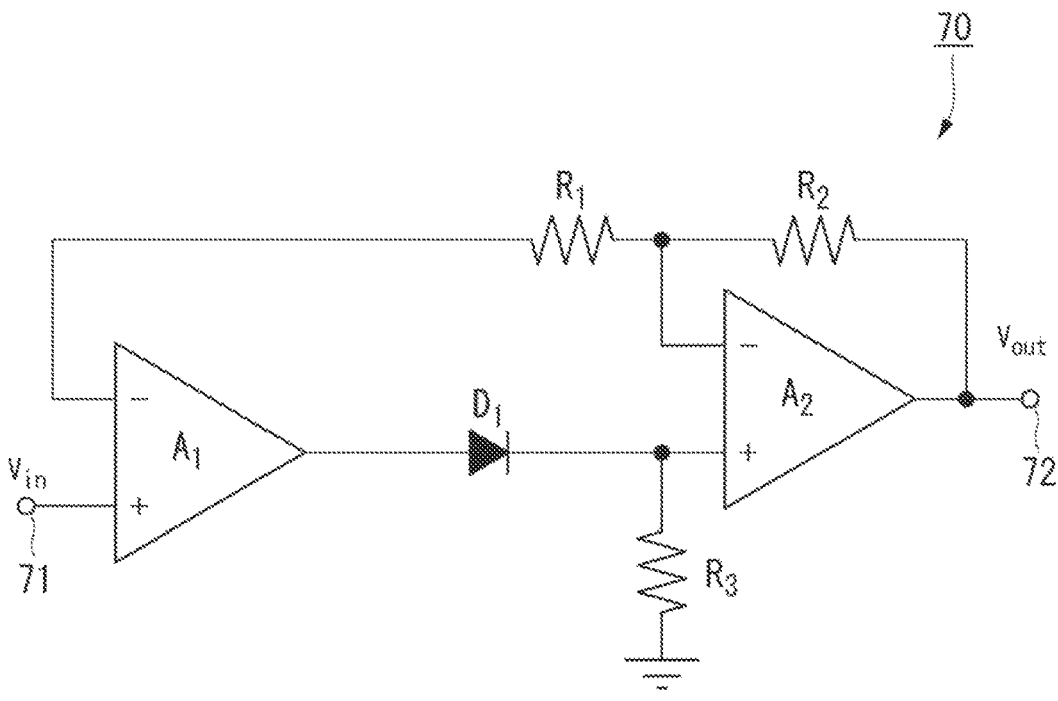
FIG. 11 is an example of an absolute value circuit according to the first embodiment.

Here, when the absolute value $|V_{out}|$ of the output voltage $V_{out}$ is obtained, an absolute value circuit 70 may be provided between the circuit 20 and the second terminal p2. FIG. 11 is an example of the absolute value circuit according to the first embodiment. The absolute value circuit 70 shown in FIG. 11 has operational amplifiers $A_1$ and $A_2$, resistors $R_1$, $R_2$ and $R_3$, and a diode $D_1$. The output voltage $V_{out}$ from the circuit 20 is input to an input terminal 71 of the absolute value circuit 70, and the absolute value $|V_{out}|$ of the output voltage $V_{out}$ from the circuit 20 is output from an output terminal 72 of the absolute value circuit 70. In this case, for example, the receiving device 200 can determine the case in which the output voltage from the absolute value circuit 70 (the output voltage from the light detection element 100) exceeds the threshold as the first signal (for example, "1"), and can determine the case in which the output voltage from the absolute value circuit 70 (the output voltage from the light detection element 100) is smaller than the threshold over the predetermined time as the second signal (for example, "0") on the basis of the output voltage $V_{out}$ from the circuit 20.

Further, in the second operation example, the direction of the sense current flowing through the light detection element may be a direction from the first ferromagnetic layer 1 toward the second ferromagnetic layer 2 or may be a direction from the second ferromagnetic layer 2 toward the first ferromagnetic layer 1. In the second operation example, the value of the sense current may be small such that the spin transfer torque due to the sense current does not become too large. In addition, in the initial state, it does not matter whether the magnetization M1 of the first ferromagnetic layer 1 and the magnetization M2 of the second ferromagnetic layer 2 are parallel or antiparallel in the second operation example.

The receiving device 200 related to the first embodiment receives the optical signal on the basis of the voltage output from the circuit 20. In addition, the light detection element 100 and the receiving device 200 related to the first embodiment can detect a change in intensity of light based on a new principle, and has a configuration that considers an actual use.

In the first operation example of the magnetic element 10, as shown in FIG. 9, when the intensity of the light applied to the first ferromagnetic layer 1 changes from the second intensity to the first intensity, since the time required for change of the magnitude of the output voltage from the magnetic element 10 from the second value to the first value is long, when the frequency of the optical signal is high, the output voltage from the magnetic element 10 does not return to the first value sufficiently. That is, for example, originally, the second signal (for example, "0") may be mistaken for the first signal (for example, "1"). On the other hand, as shown in FIG. 9, when the intensity of the light applied to the first ferromagnetic layer 1 changes from the second intensity to the first intensity, since the amount of change per unit time of the output voltage from the magnetic element 10 is largest immediately after the intensity of the light changes, a large output voltage of the absolute value is obtained from the circuit 20 immediately after the intensity of the light changes. That is, in the case in which the optical signal is received on the basis of the output voltage from the circuit 20, when the intensity of the light applied to the first ferromagnetic layer 1 changes from the second intensity to the first intensity, since it is possible to determine the intensity change of the optical signal on the basis of the large output voltage of the absolute value immediately after the intensity of the light changes, an error is less likely to occur even when the frequency of the optical signal is high in the first operation example of the magnetic element 10.

Second Embodiment

A receiving device according to a second embodiment is distinguished from the receiving device 200 according to the first embodiment in the configuration of the light detection element.

Figure 12:
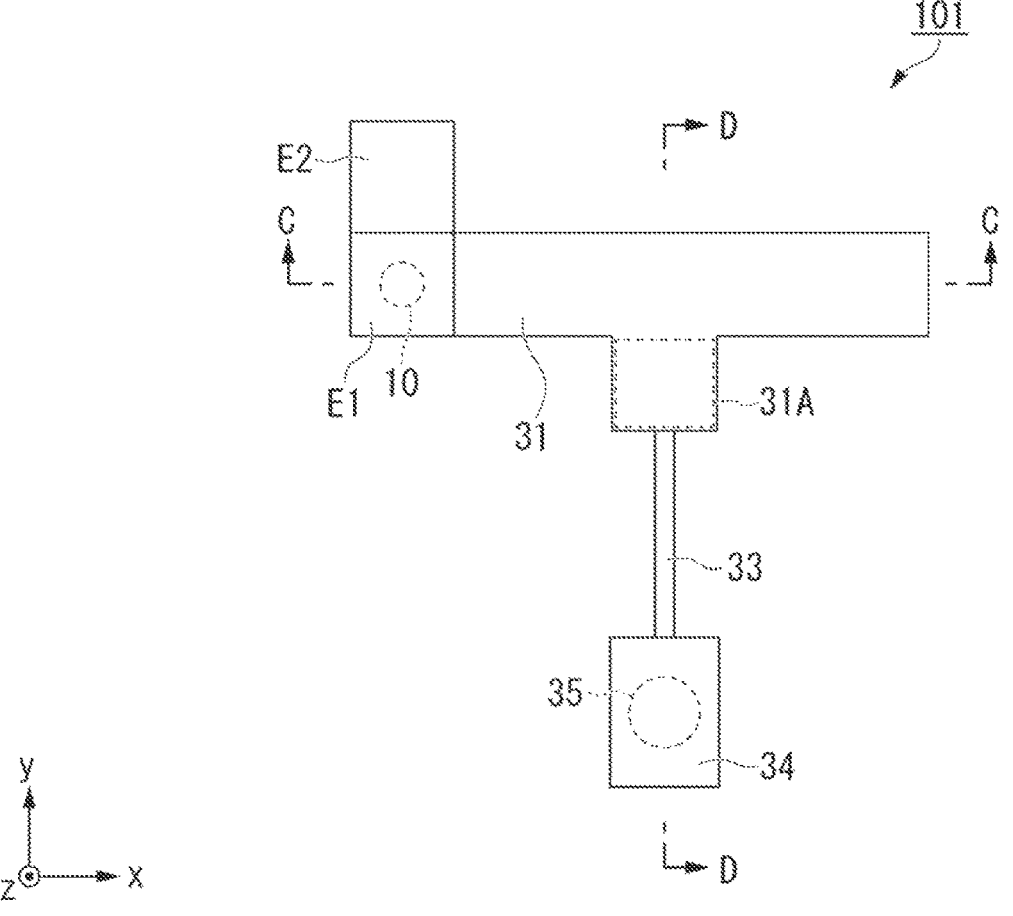
FIG. 12 is a plan view of a feature portion of a light detection element according to a second embodiment.
Figure 13:
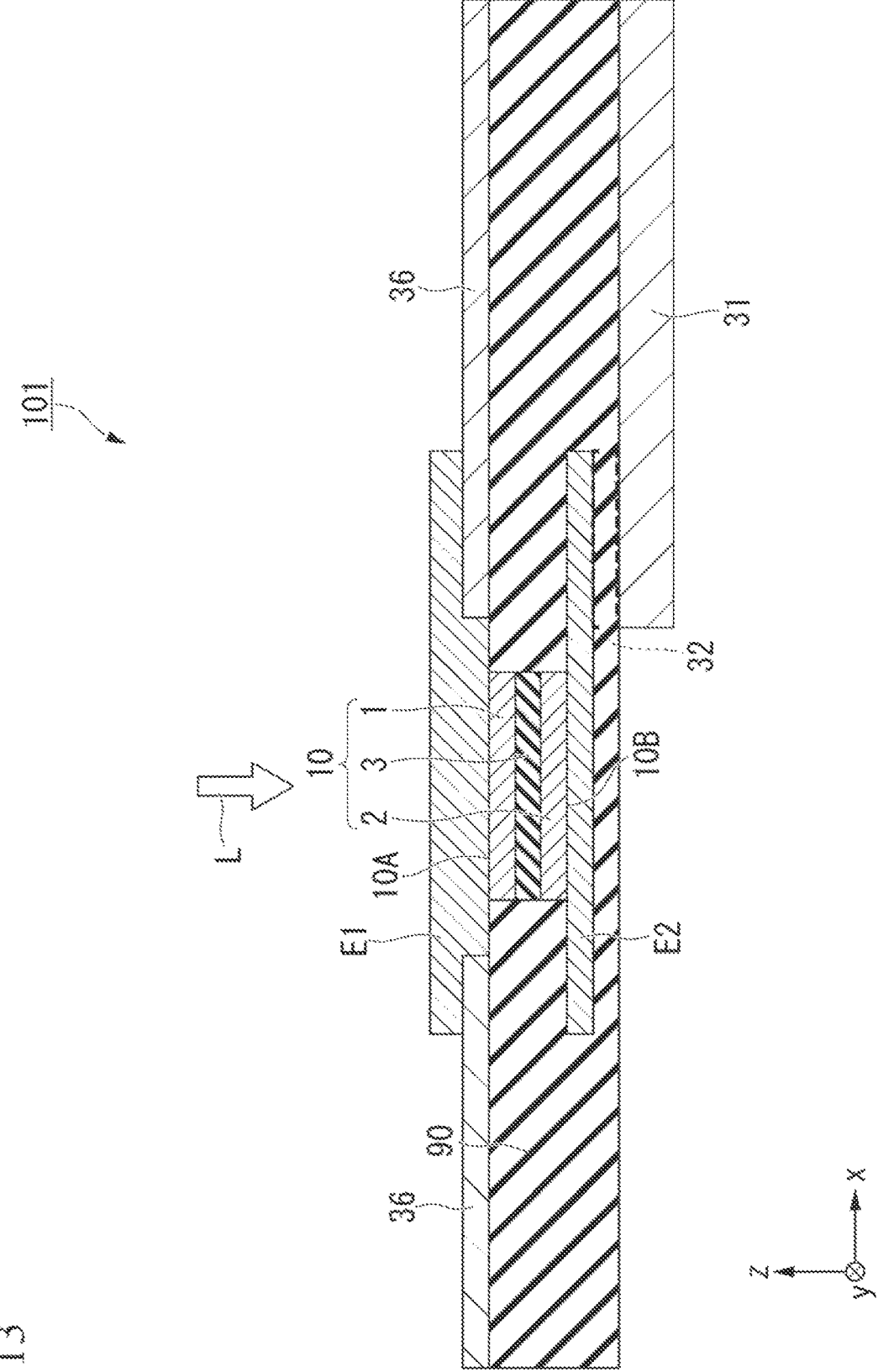
FIG. 13 is a cross-sectional view of the feature portion of the light detection element according to the second embodiment.
Figure 14:
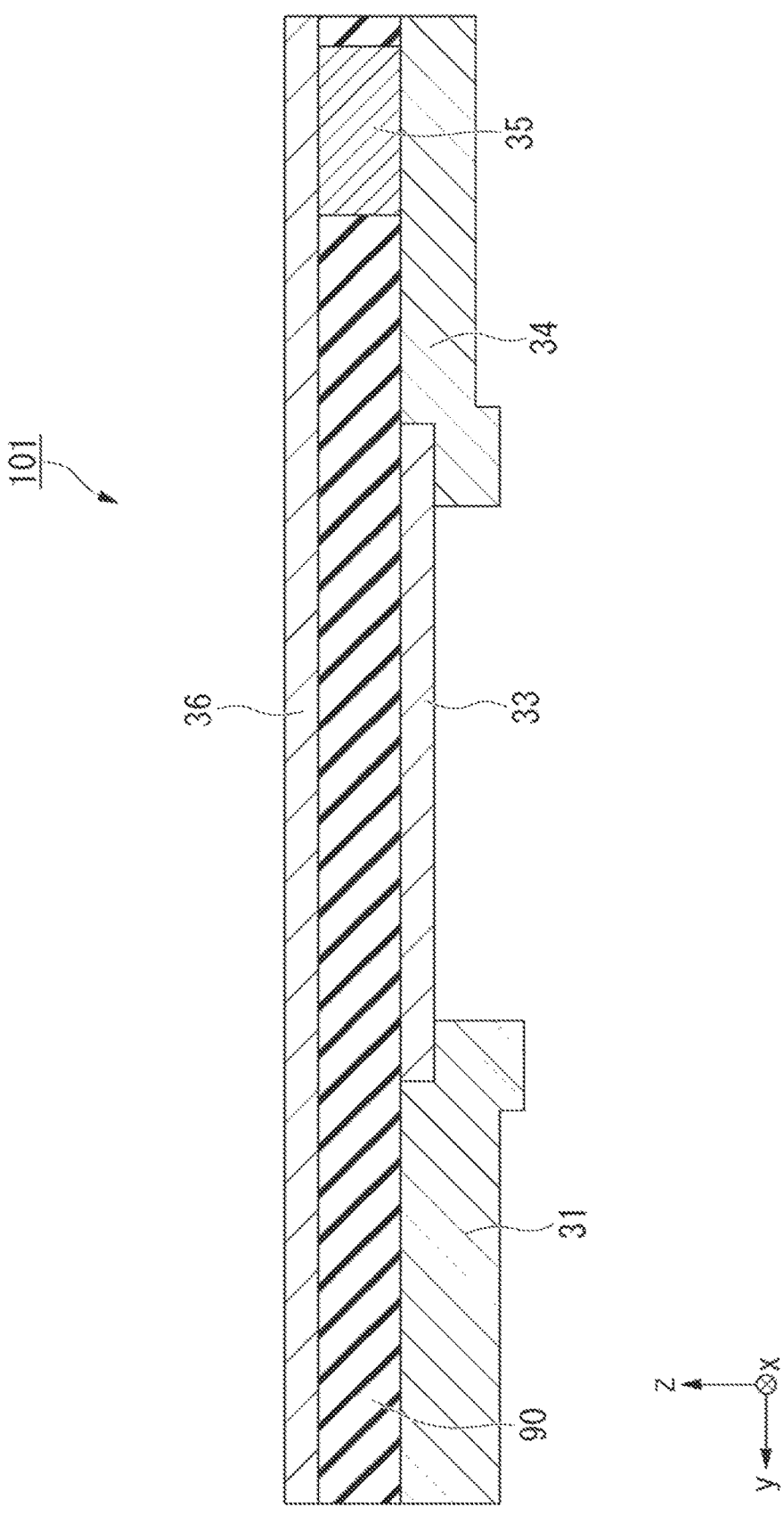
FIG. 14 is a cross-sectional view of the feature portion of the light detection element according to the second embodiment.

FIG. 12 is a plan view of a feature portion of a light detection element 101 according to the second embodiment. In FIG. 12, partial configurations of an insulating layer 90, a fourth electrode layer 36, and the like, which will be described below, will be omitted. FIG. 13 and FIG. 14 are cross-sectional views of the feature portion of the light detection element 101 according to the second embodiment.

FIG. 13 is a cross-sectional view along line C-C in FIG. 12. FIG. 14 is a cross-sectional view along line D-D in FIG. 12.

The light detection element 101 includes, for example, a magnetic element 10, an upper electrode E1, a lower electrode E2, a third electrode layer 31, a second dielectric body 32, a resistor 33, a connecting electrode 34, a second connecting via 35, a fourth electrode layer 36, and an insulating layer 90. In the light detection element 101, the same components as the light detection element 100 are designated by the same reference signs and description thereof will be omitted.

The upper electrode E1 comes into contact with, for example, the first surface 10A of the magnetic element 10. The upper electrode E1 comes into contact with the fourth electrode layer 36. The upper electrode E1 and the fourth electrode layer 36 may be integrated. The upper electrode E1 is, for example, partially embedded in an opening formed in the fourth electrode layer 36.

The lower electrode E2 comes into contact with, for example, the second surface 10B of the magnetic element 10. The lower electrode E2 is connected to the power supply 80 via the first terminal p1. A part of the lower electrode E2 faces a part of the third electrode layer 31 with the second dielectric body 32 sandwiched therebetween.

For example, as shown in FIGS. 13 and 14, the third electrode layer 31 is disposed such that a position in the z direction is closer to the second surface 10B than the magnetic element 10 (the side in the −z direction). A part of the third electrode layer 31 faces a part of the lower electrode E2 with the second dielectric body 32 sandwiched therebetween. The same material as the material exemplified in the first electrode layer 21 can be used in the third electrode layer 31. The same material as the material exemplified in the first dielectric body 22 can be used in the second dielectric body 32. A position of the second dielectric body 32 in the z direction is located between the third electrode layer 31 and the second surface 10B of the magnetic element 10. The second dielectric body 32 may be a part of the insulating layer 90, and for example, a portion of the insulating layer 90 that overlaps the lower electrode E2 and the third electrode layer 31 in the z direction. The third electrode layer 31 is an electrode configured to output an output voltage of the circuit 20, which is connected to the signal processing unit 110 via the second terminal p2.

The second dielectric body 32 and the third electrode layer 31 constitute at least a part of the capacitor C shown in FIG. 2. The third electrode layer 31 and the lower electrode E2 correspond to polar plates of the capacitor C. and the second dielectric body 32 corresponds to a dielectric body between the polar plates. For example, when the silicon oxide with a relative dielectric constant of 3.8 is used as the material of the second dielectric body 32, an interval between the lower electrode E2 and the third electrode layer 31 in the z direction is 0.1 μm, a length in the x direction of a portion in which the lower electrode E2 and the third electrode layer 31 overlap in the z direction is 0.8 μm, and a length in the y direction is 5 μm, a capacity value of the capacitor C can be set to 0.001 pF.

When there is no need to flow the current to the magnetic element 10 from the outside and the first terminal p1 and the power supply 80 are unnecessary, the lower electrode E2 may be removed. When the lower electrode E2 is removed, a part of the third electrode layer 31 is disposed to overlap the magnetic element 10 in the z direction. In this case, the second dielectric body 32 is disposed to be sandwiched between the magnetic element 10 and the third electrode layer 31 in the z direction, and the layer of the magnetic element 10 on the side of the second surface 10B and the third electrode layer 31 correspond to the polar plates of the capacitor C, and the second dielectric body 32 corresponds to the dielectric body between the polar plates.

The third electrode layer 31 has, for example, a connecting part 31A between the magnetic element 10 (the second dielectric body 32) and the second terminal p2. The connecting part 31A is a portion where the resistor 33 is connected to the third electrode layer 31. The connecting part 31A is provided to protrude in a direction crossing a line segment that connects the magnetic element 10 and the second terminal p2, for example, when seen in a plan view in the z direction.

The resistor 33 constitutes the resistor R of FIG. 2. The resistor 33 is branched off from the third electrode layer 31 and connected to the third electrode layer 31 at the connecting part 31A. The resistor 33 is located between the connecting part 31A of the third electrode layer 31 and the second connecting via 35. The resistor 33 connects, for example, the connecting part 31A and the connecting electrode 34, and is electrically connected to the third electrode layer 31 and the second connecting via 35. The resistor 33 can be designed with a material, a cross-sectional area, or the like, according to the required resistance value. The same material as the material exemplified in the resistor 23 can be used in the resistor 33. For example, when the NiCr alloy with a volume resistivity of 1 μΩm is used as the material of the resistor 33, a thickness of the resistor 23 in the z direction is 0.01 μm, a width in the x direction is 1 μm, and a length in the y direction is 10 μm, a resistance value of the resistor 23 can be set to 1000Ω.

The connecting electrode 34 connects the resistor 33 and the second connecting via 35. The connecting electrode 34 may be removed. The resistor 33 may be directly connected to the second connecting via 35. The same material as the material exemplified in the first electrode layer 21 can be used in the connecting electrode 34.

The second connecting via 35 passes through the insulating layer 90 in the z direction. The second connecting via 35 electrically connects the resistor 33 and the fourth electrode layer 36. The second connecting via 35 connects, for example, the connecting electrode 34 and the fourth electrode layer 36. The same material as the material exemplified in the first electrode layer 21 can be used in the second connecting via 35.

The fourth electrode layer 36 is electrically connected to the first surface 10A of the magnetic element 10 and the second connecting via 35. For example, as shown in FIGS. 13 and 14, the fourth electrode layer 36 is disposed such that a position in the z direction is closer to the first surface 10A than the magnetic element 10 (the side in the +z direction). The fourth electrode layer 36 is electrically connected to the third electrode layer 31 via the second connecting via 35 and the resistor 33. The fourth electrode layer 36 is connected to the reference potential, for example, grounded. The fourth electrode layer 36 has a shape expanding along, for example, a xy plane. The same material as the material exemplified in the first electrode layer 21 can be used in the fourth electrode layer 36.

The circuit diagram of the light detection element 101 is the same as the circuit diagram of the light detection element 100 shown in FIG. 2, and the receiving device according to the second embodiment is operated in the same manner as the receiving device according to the first embodiment. In addition, the receiving device according to the second embodiment exhibits the same effect as the receiving device 200 according to the first embodiment.

So far, while the case in which the circuit 20 is the CR circuit has been exemplified in the first embodiment and the second embodiment, it is not limited thereto as long as the circuit 20 is the circuit configured to output the voltage having the magnitude corresponding to the amount of change per unit time of the output voltage output from the magnetic element 10 by the optical signal.

Figure 15:
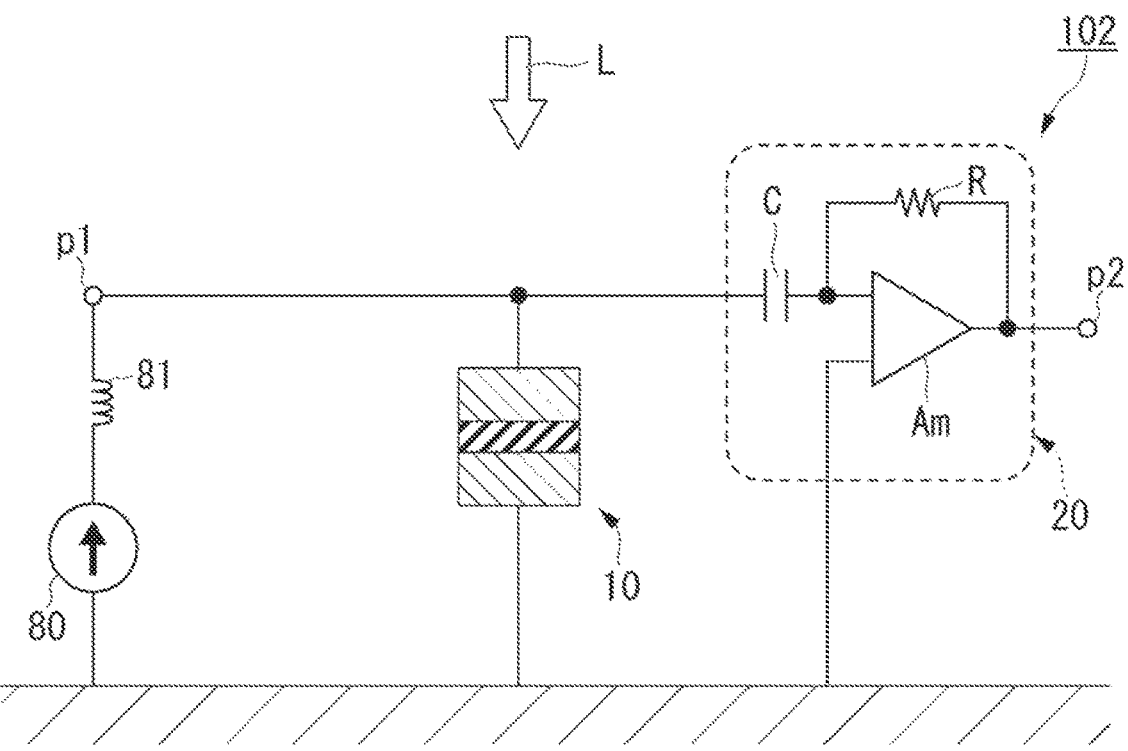
FIG. 15 is a circuit diagram of a light detection element according to a variant.

For example, like a light detection element 102 shown in FIG. 15, the circuit 20 may be a circuit having an operational amplifier. The circuit 20 shown in FIG. 15 has the operational amplifier Am, the resistor R and the capacitor C. The circuit 20 shown in FIG. 15 is a differential circuit configured to output a voltage corresponding to a value obtained by differentiating the input voltage input to the circuit 20 by time.

Third Embodiment

A receiving device according to a third embodiment is distinguished from the receiving device 200 according to the first embodiment in a configuration of a light detection element.

Figure 16:
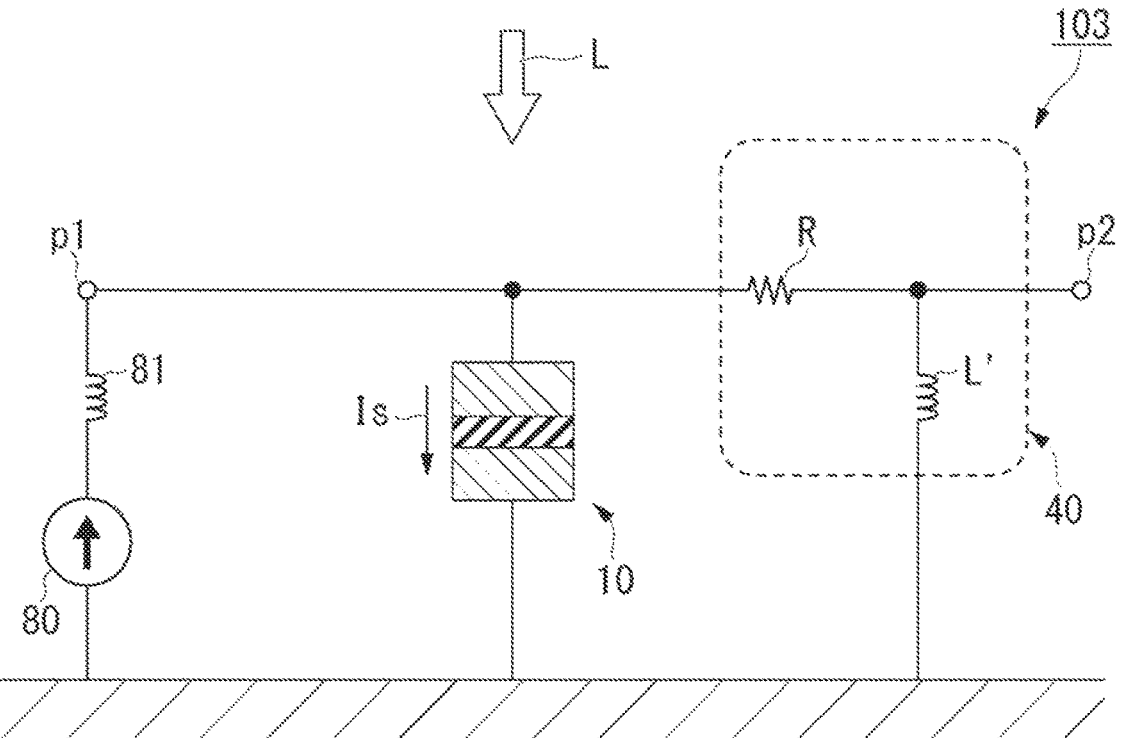
FIG. 16 is a circuit diagram of a light detection element according to a third embodiment.

FIG. 16 is a circuit diagram of a light detection element 103 according to the third embodiment. The light detection element 103 includes, for example, a magnetic element 10, a circuit 40, a first terminal p1, and a second terminal p2. In the light detection element 103, the same components as the light detection element 100 are designated by the same reference signs and description thereof will be omitted.

The circuit 40 is a circuit configured to output a voltage with a magnitude corresponding to an amount of change per unit time of an output voltage output from the magnetic element 10 according to irradiation of light L including an optical signal. An input voltage input to the circuit 40 corresponds to the output voltage output from the magnetic element 10 according to the irradiation of the light L including the optical signal. The circuit 40 is, for example, a differential circuit configured to output a voltage corresponding to a value obtained by differentiating the input voltage input to the circuit 40 by time.

For example, as shown in FIG. 16, the circuit 40 is an RL circuit including a resistor R and an inductor L'. The RL circuit outputs a voltage with a magnitude corresponding to an amount of change per unit time of an input voltage input to the RL circuit, substantially like the differential circuit, by adjusting a resistance value of the resistor R and an inductance of the inductor L'. The resistor R is serially connected to the magnetic element 10 between the reference potential and the second terminal p2. The inductor L' is parallelly connected to the magnetic element 10 and the resistor R, which are connected in series, between the reference potential and the second terminal p2. When seen from a route including the magnetic element 10, the resistor R and the inductor L', the magnetic element 10, the resistor R and the inductor L' are serially connected in sequence.

Figure 17:
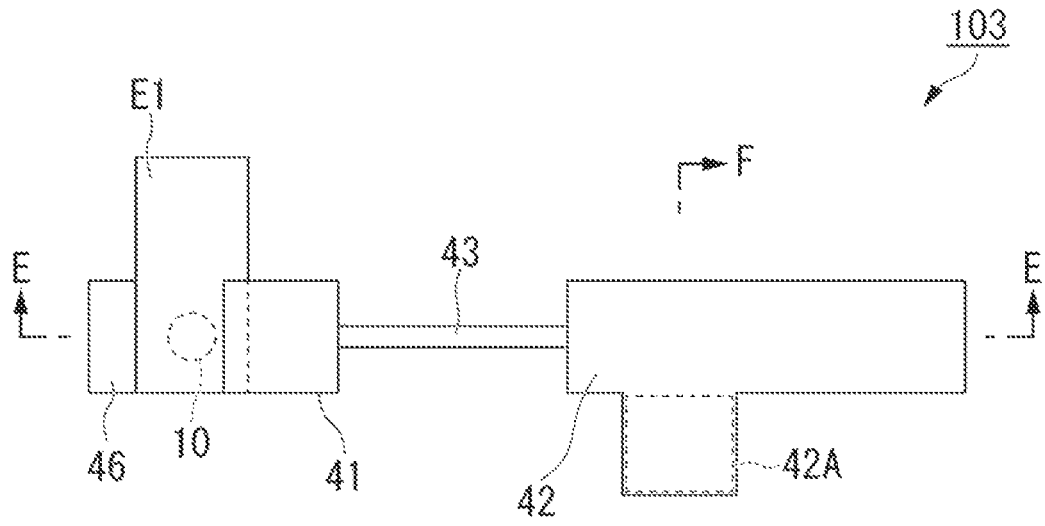
FIG. 17 is a plan view of the feature portion of the light detection element according to the third embodiment.
Figure 17:
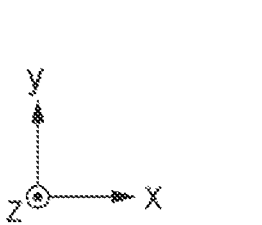
Figure 17:
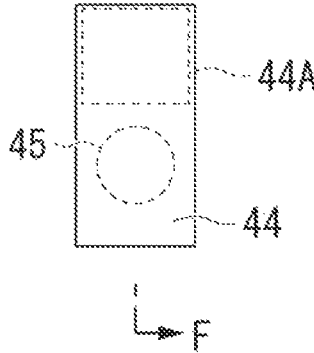
Figure 18:
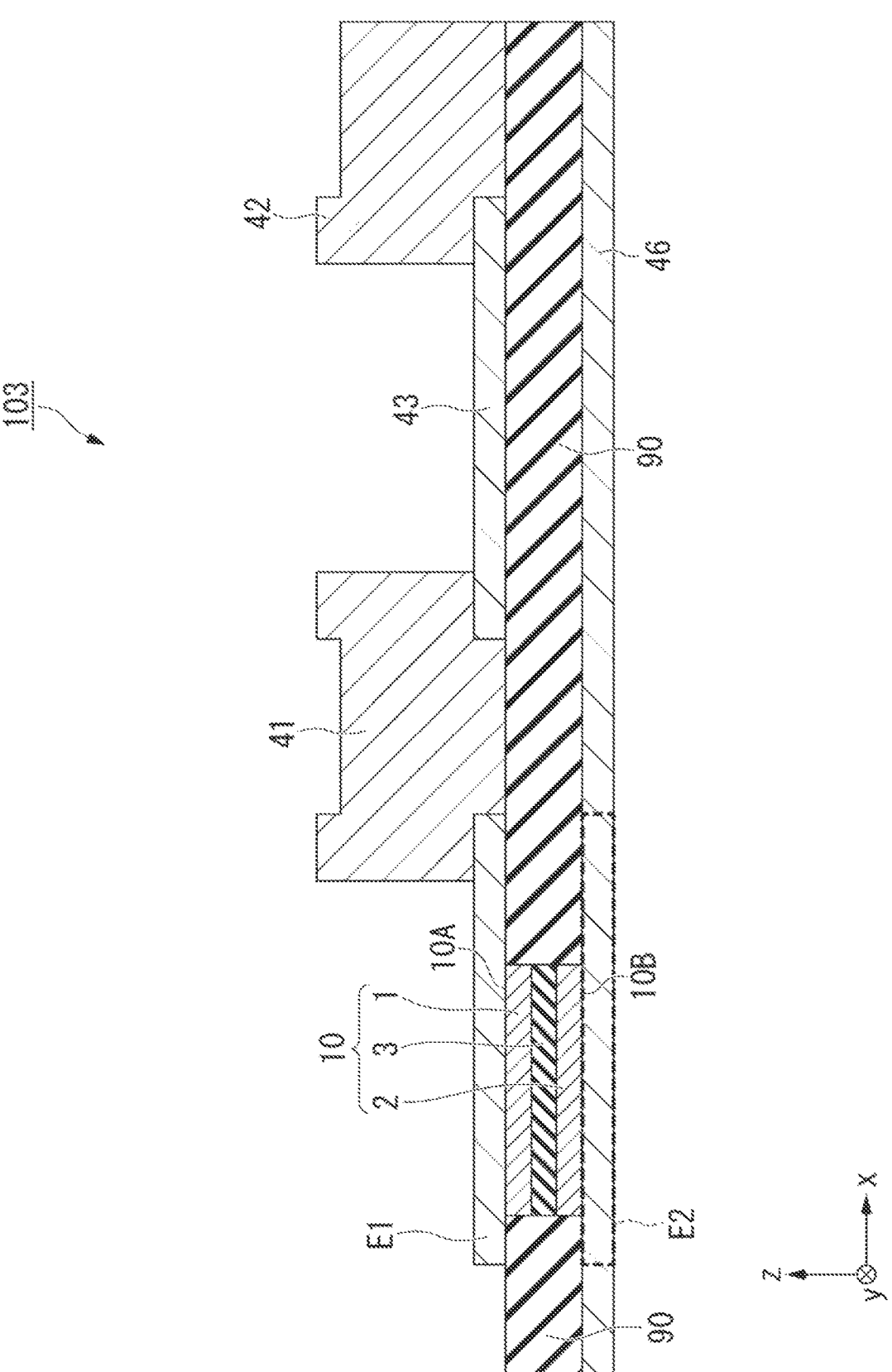
FIG. 18 is a cross-sectional view of the feature portion of the light detection element according to the third embodiment.
Figure 19:
FIG. 19 is a cross-sectional view of the feature portion of the light detection element according to the third embodiment.
Figure 19:
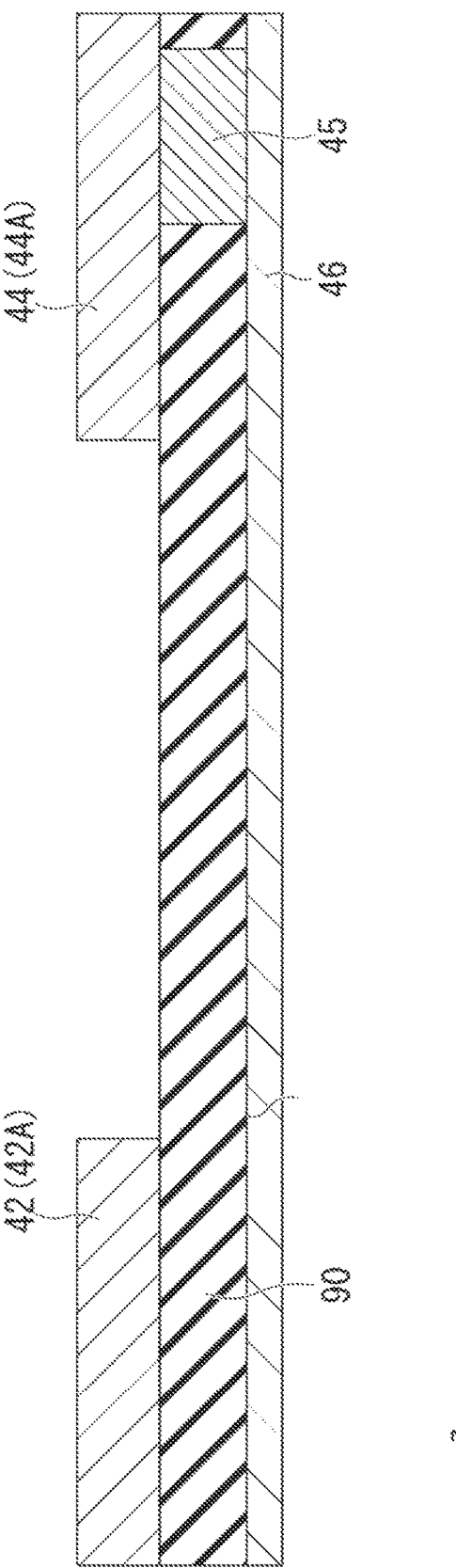

FIG. 17 is a plan view of a feature portion of the light detection element 103 according to the third embodiment. In FIG. 17, partial configurations of the inductor L', the insulating layer 90 (to be described below), the lower electrode E2, and the like, are omitted. FIG. 18 and FIG. 19 are cross-sectional views of the feature portion of the light detection element 103 according to the first embodiment. FIG. 18 is a cross-sectional view along line E-E in FIG. 17. FIG. 19 is a cross-sectional view along line F-F in FIG. 17.

The light detection element 103 includes, for example, a magnetic element 10, an upper electrode E1, a lower electrode E2, a first electrode layer 41, a resistor 43, a first connecting electrode 42, a second connecting electrode 44, a first connecting via 45, a second electrode layer 46, and an insulating layer 90.

The magnetic element 10 is the same as the magnetic element 10 according to the first embodiment. The upper electrode E1 is disposed, for example, on the side of the first surface 10A of the magnetic element 10, and comes into contact with the first surface 10A of the magnetic element 10 and the first electrode layer 41. The upper electrode E1 and the first electrode layer 41 may be integrated. The lower electrode E2 is disposed, for example, on the side of the second surface 10B of the magnetic element 10, and comes into contact with the second surface 10B of the magnetic element 10 and the second electrode layer 46. The lower electrode E2 may be a part of the second electrode layer 46.

The first electrode layer 41 is electrically connected to the first surface 10A of the magnetic element 10. For example, as shown in FIG. 18, the first electrode layer 41 is electrically connected to the first surface 10A via the upper electrode E1. The same material as exemplified as the material of the first electrode layer 21 of the first embodiment can be used in the first electrode layer 41. The first electrode layer 41 is connected to the resistor 43.

The resistor 43 constitutes the resistor R of FIG. 16. The same material as exemplified as the material of the resistor 23 of the first embodiment can be used in the resistor 43. The resistor 43 connects the first electrode layer 41 and the first connecting electrode 42. The resistor 43 can be designed with a material, a cross-sectional area, or the like, according to the obtained resistance value. For example, when the NiCr alloy with a volume resistivity of 1 $\mu\Omega$m is used as the material of the resistor 43, a thickness of the resistor 43 in the z direction is 0.4 $\mu$m, a length in the x direction is 2 $\mu$m, and a width in the y direction is 1 $\mu$m, a resistance value of the resistor 43 can be set to 5$\Omega$.

The first connecting electrode 42 connects the resistor 43 and the inductor L'. The same material as exemplified as the material of the first electrode layer 21 of the first embodiment can be used in the first connecting electrode 42. The first connecting electrode 42 has a pad 42A. The inductor L' is connected to the pad 42A. For example, a chip inductor can be used in the inductor L'. An inductance value of the inductor L' is, for example, 0.1 mH.

The second connecting electrode 44 connects the inductor L' and the first connecting via 45. The same material as exemplified as the material of the first electrode layer 21 of the first embodiment can be used in the second connecting electrode 44. The second connecting electrode 44 has a pad 44A. The inductor L' is connected to the pad 44A.

The first connecting via 45 passes through the insulating layer 90 in the z direction. The first connecting via 45 is electrically connected to the second connecting electrode 44 (the pad 44A) and the second electrode layer 46. The same material as exemplified as the material of the first electrode layer 21 of the first embodiment can be used in the first connecting via 45.

The second electrode layer 46 is electrically connected to the second surface 10B of the magnetic element 10 and the first connecting via 45. The second electrode layer 46 is connected to a reference potential, for example, grounded. The second electrode layer 46 has a shape expanding along, for example, a xy plane. The same material as exemplified as the material of the first electrode layer 21 of the first embodiment can be used in the second electrode layer 46.

Next, an operation of the light detection element 103 according to the third embodiment will be described. The light L including the optical signal with a change of intensity of the light is applied to the first ferromagnetic layer 1 of the magnetic element 10. The light L including the optical signal applied to the first ferromagnetic layer 1 is replaced with the electric signal by the magnetic element 10 and input to the circuit 40.

Figure 20:
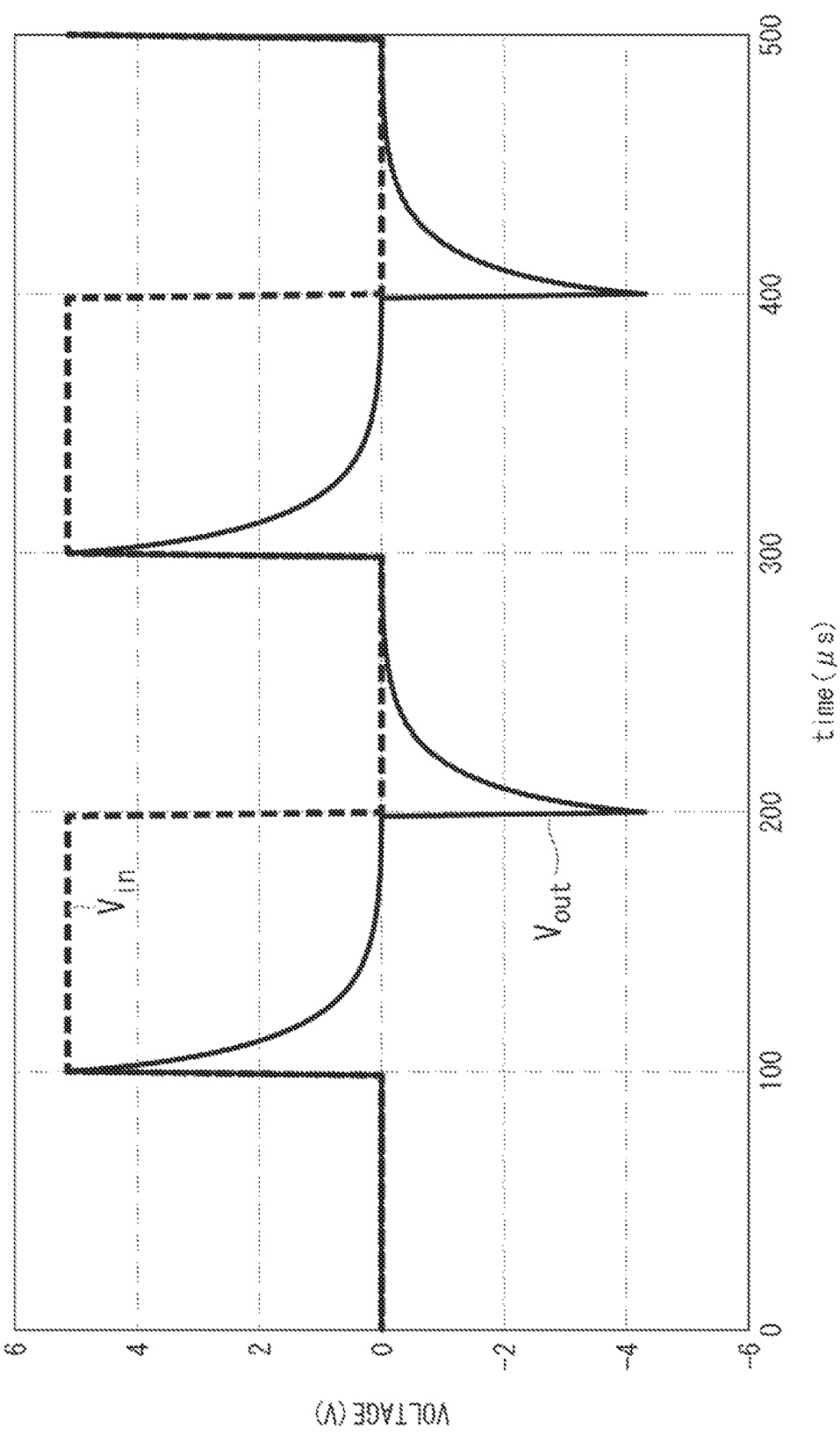
FIG. 20 is a graph showing a time change of an input voltage input to an RL circuit and an output voltage from the RL circuit.

FIG. 20 is a graph showing a time change between the input voltage $V_{in}$ input to the RL circuit and the output voltage $V_{out}$ from the RL circuit. In FIG. 20, a resistance value of the resistor R of the RL circuit is 5$\Omega$, an inductance value of the inductor L' is 0.1 mH, and a frequency of the input voltage $V_{in}$ is 5 kHz. As shown in FIG. 20, the output voltage $V_{out}$ indicates a large value of an absolute value corresponding to a portion with a large absolute value of an amount of change per unit time of the input voltage $V_{in}$, and indicates a small value of an absolute value corresponding to a portion with a small absolute value of an amount of change per unit time of the input voltage $V_{in}$ (in the example of FIG. 20, a portion in which an amount of change per unit time is zero). That is, the RL circuit outputs the voltage corresponding to the amount of change per unit time of the input voltage $V_{in}$ as the output voltage $V_{out}$, substantially like the differential circuit, by adjusting the inductance value of the inductor L' and the resistance value of the resistor R. In the RL circuit, a value obtained by dividing the inductance value of the inductor L' by the resistance value of the resistor R is a time constant, and an aspect of the time change of the output voltage $V_{out}$ with respect to the time change of the input voltage $V_{in}$ changes according to the value of the time constant. The time constant is set according to, for example, the frequency of the input voltage $V_{in}$. For example, the inductance value of the inductor L' and the resistance value of the resistor R are set such that the time constant is smaller than a half of a cycle that is a reciprocal number of the frequency of the input voltage $V_{in}$. In the example of FIG. 20, the time constant is 0.1 (mH)/5 ($\Omega$)=20 ($\mu$s), which is smaller than 100 $\mu$s that is a length of a half cycle of the input voltage $V_{in}$.

The circuit 40 in the light detection element 103 according to the third embodiment is the RL circuit. That is, the input voltage $V_{in}$ shown in FIG. 20 corresponds to the output voltage from the magnetic element 10, and the output voltage $V_{out}$ shown in FIG. 20 corresponds to the output voltage from the circuit 40 (the output voltage from the light detection element 103). When the input voltage $V_{in}$ to the circuit 40 (the output voltage from the magnetic element 10) increases, the output voltage $V_{out}$ from the circuit 40 indicates a large positive value, and when the input voltage $V_{in}$ to the circuit 40 (the output voltage from the magnetic element 10) decreases, the output voltage $V_{out}$ from the circuit 40 indicates a large negative value of the absolute value.

Like the case of the first embodiment, for example, the receiving device 200 can determine that it is switched from the first signal (for example, "1") to the second signal (for example, "0") when the output voltage from the circuit 40 exceeds a threshold, determine that it is switched from the second signal (for example, "0") to the first signal (for example, "1") when the output voltage from the circuit 20 is smaller than the threshold, and determine that it is the same signal as the signal before when the output voltage from the circuit 40 is within a range of the threshold (as the first signal (for example, "1") is remained or the second signal (for example, "0") is remained). In addition, the receiving device 200 can determine that the intensity of the light L changes when the absolute value of the output voltage is equal to or smaller than the threshold and determine that the intensity of the light L is not changed when the absolute value of the output voltage is less than the threshold by obtaining the absolute value of the output voltage from the circuit 40.

In addition, like the first embodiment, the receiving device 200 may determine that the case in which the absolute value $|V_{out}|$ of the output voltage $V_{out}$ from the circuit 40 exceeds the threshold is the first signal (for example, "1"), and determine that the absolute value $|V_{out}|$ of the output voltage $V_{out}$ from the circuit 40 is smaller than the threshold over the predetermined time is the second signal (for example, "0"). In addition, like the light detection element 100 according to the first embodiment, the absolute value circuit 70 may be provided between the circuit 40 and the second terminal p2.

The receiving device according to the third embodiment exhibits the same effects as the receiving device 200 according to the first embodiment since the circuit 40 exhibits the same function as the circuit 20.

The light detection element and the receiving device according to the embodiment can be applied to the transceiver device or the like of the communication system.

Figure 21:
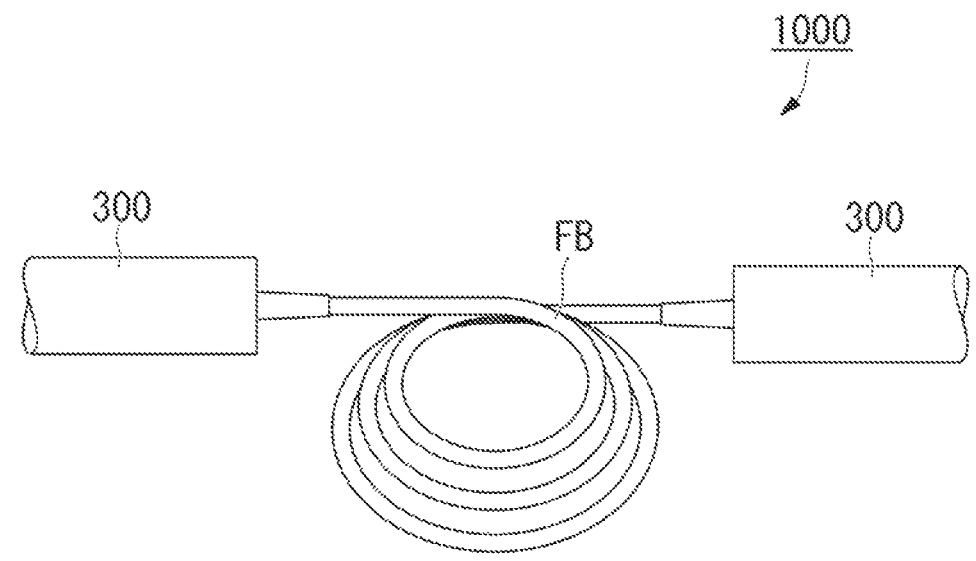
FIG. 21 is a conceptual view of a communication system according to a first application example.

FIG. 21 is a conceptual view of a communication system 1000 according to a first application example. The communication system 1000 shown in FIG. 21 includes a plurality of transceiver devices 300 and an optical fiber FB that connects the transceiver devices 300. The communication system 1000 can be used for, for example, short- and medium-distance communication such as within and between data centers, and long-distance communication such as between cities. The transceiver devices 300 are installed in, for example, the data center. The optical fiber FB connects, for example, the data centers. The communication system 1000 performs, for example, communication between the transceiver devices 300 via the optical fiber FB. The communication system 1000 may perform wireless communication between the transceiver devices 300 without going through the optical fiber FB.

Figure 22:
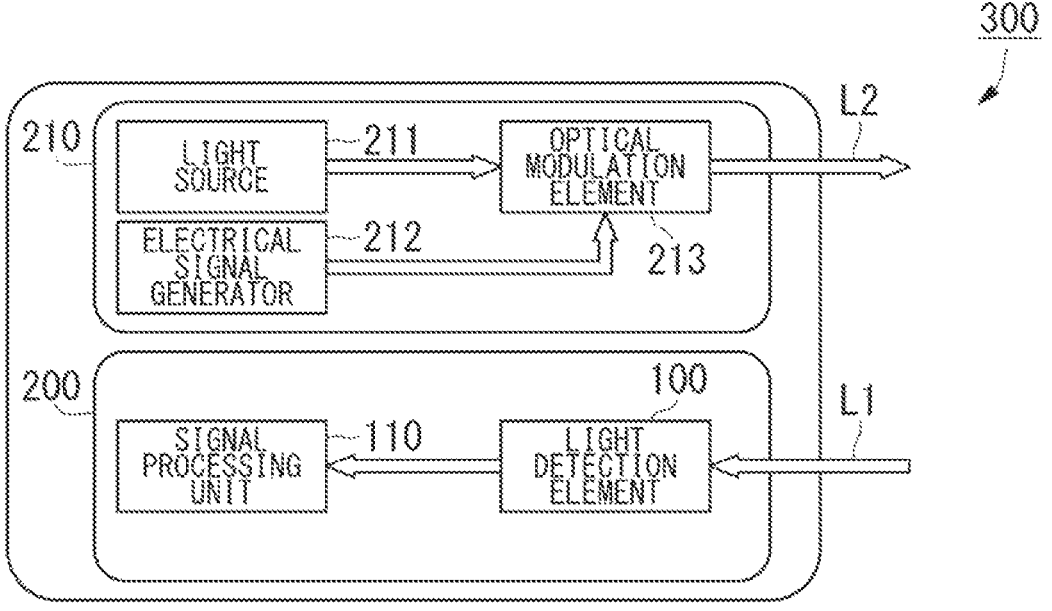
FIG. 22 is a block diagram of a transceiver device according to the first application example.

FIG. 22 is a block diagram of the transceiver devices 300 according to the first application example. The transceiver device 300 includes the receiving device 200 and a transmitting device 210. The receiving device 200 receives an optical signal L1, and the transmitting device 210 transmits an optical signal L2. The light used for transmission and reception is, for example, near infrared light with a wavelength of 1000 nm or more and 2000 nm or less.

The receiving device 200 includes, for example, the light detection element 100 and the signal processing unit 110. The light detection element 100 may be replaced with the light detection element 101 or 102. The light detection element 100 converts the optical signal L1 into an electric signal. Light including the optical signal L1 with a change of intensity of the light is applied to the magnetic element 10. The light applied to the magnetic element 10 is, for example, a laser beam. The signal processing unit 110 processes the electric signal converted by the light detection element 100. The signal processing unit 110 receives the signal included in the optical signal L1 by processing the electric signal generated from the light detection element 100.

The transmitting device 210 includes, for example, a light source 211, an electric signal generator 212, and an optical modulation element 213. The light source 211 is, for example, a laser element. The light source 211 may be provided outside the transmitting device 210. The electric signal generator 212 generates an electric signal based on the transmitted information. The electric signal generator 212 may be integrated with the signal conversion element of the signal processing unit 110. The optical modulation element 213 modulates the light output from the light source 211 and outputs the optical signal L2 based on the electric signal generated by the electric signal generator 212.

In addition, so far, while the example in which the transceiver device is applied to the communication system 1000 shown in FIG. 21 is shown, the communication system is not limited to the case.

Figure 23:
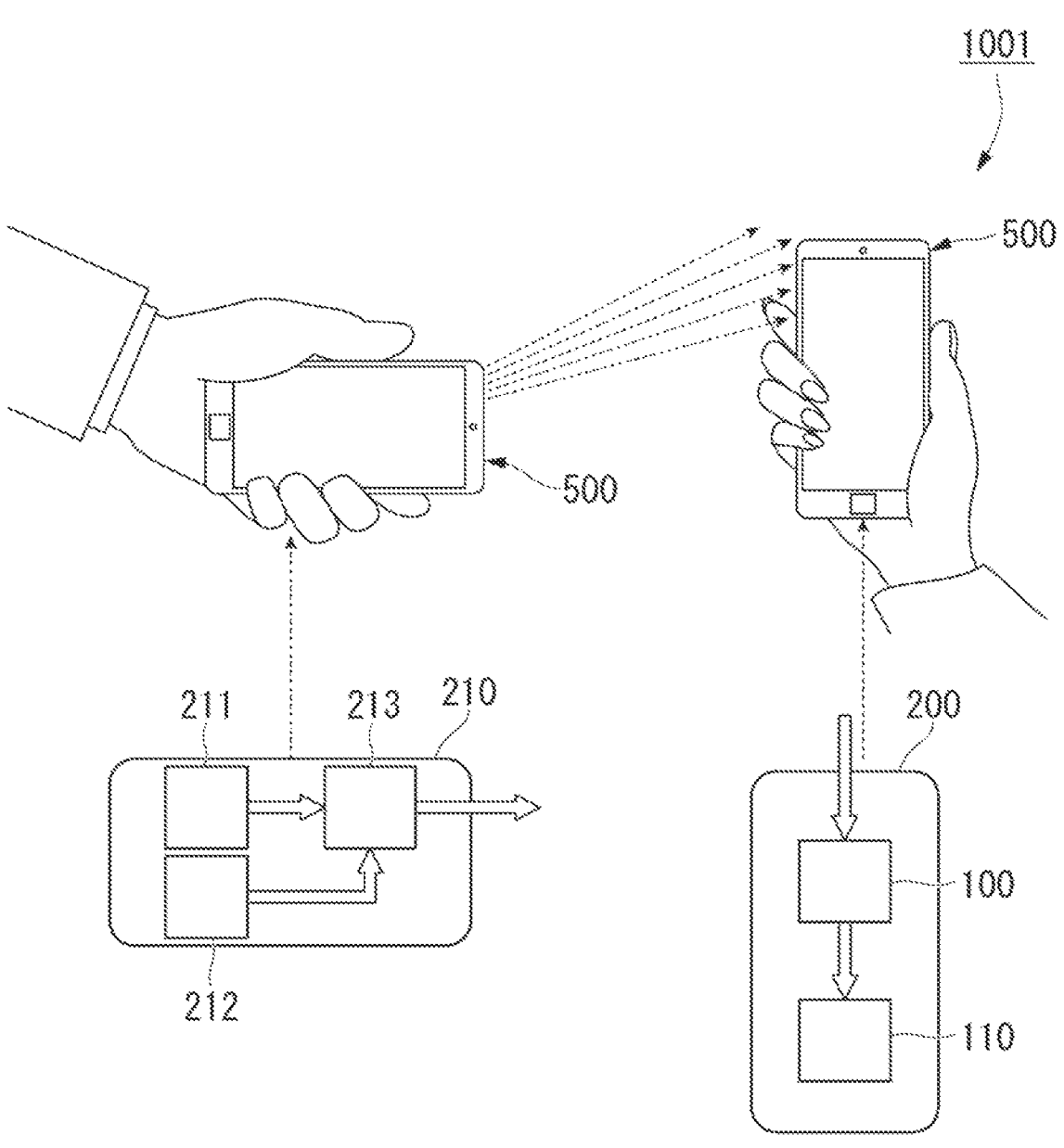
FIG. 23 is a conceptual view of another example of the communication system.

For example, FIG. 23 is a conceptual view of another example of the communication system. A communication system 1001 shown in FIG. 23 performs communication between two portable terminal devices 500. The portable terminal devices 500 are, for example, a smartphone, a tablet, and the like.

Each of the portable terminal devices 500 includes the receiving device 200 and the transmitting device 210. The optical signal transmitted from the transmitting device 210 of one of the portable terminal devices 500 is received by the receiving device 200 of the other portable terminal device 500. Light used for transmission and reception between the portable terminal devices 500 is, for example, visible light. Each of the receiving devices 200 includes, for example, the light detection element 100 and the signal processing unit 110. The light detection element 100 may be replaced with the light detection element 101 or 102.

Figure 24:
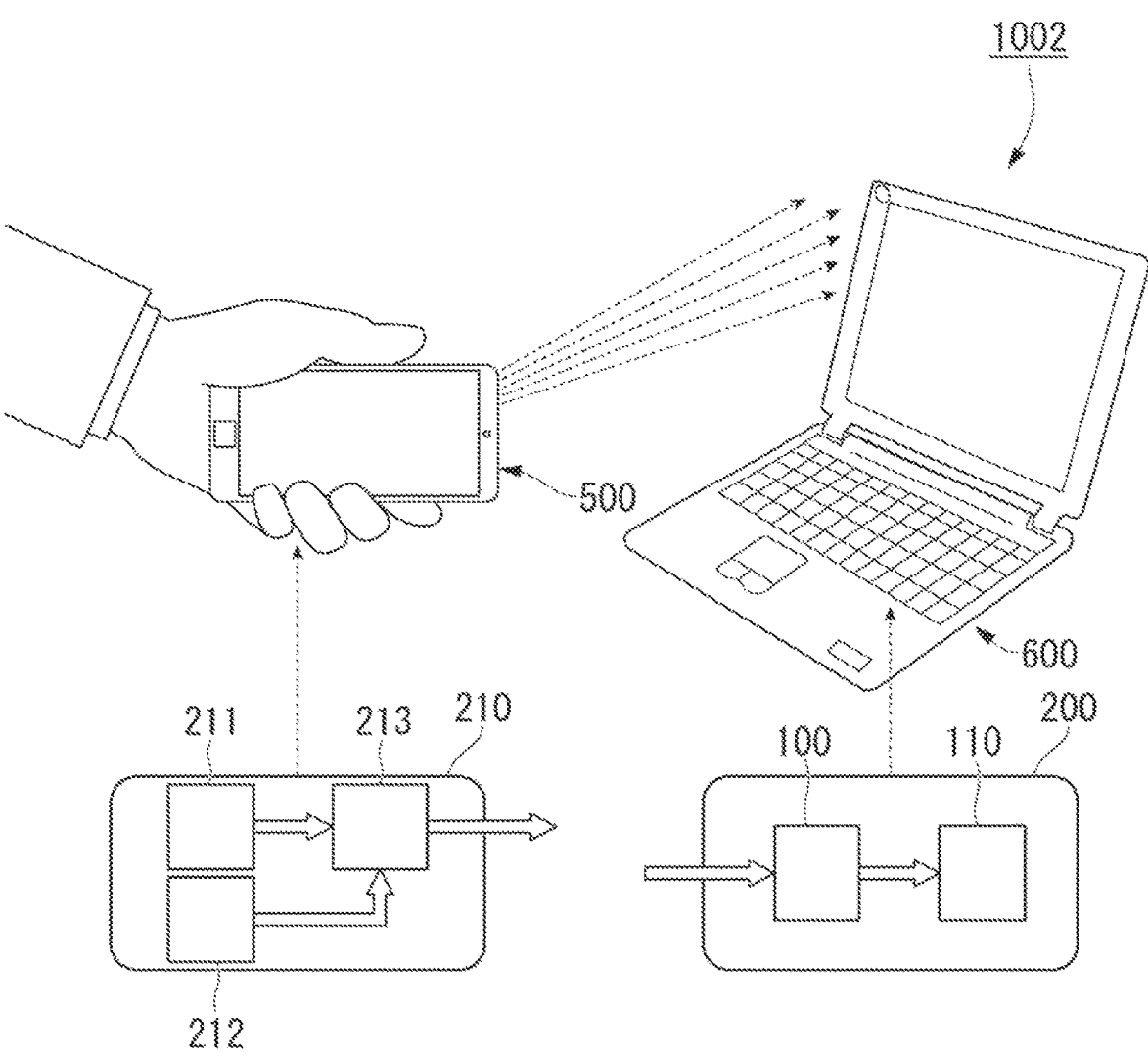
FIG. 24 is a conceptual view of another example of the communication system.

In addition, for example, FIG. 24 is a conceptual view of another example of the communication system. A communication system 1002 shown in FIG. 24 performs communication between the portable terminal devices 500 and an information processing device 600. The information processing device 600 is, for example, a personal computer.

The portable terminal device 500 includes the transmitting device 210, and the information processing device 600 includes the receiving device 200. The optical signal transmitted from the transmitting device 210 of the portable terminal device 500 is received by the receiving device 200 of the information processing device 600. The light used for transmission and reception between the portable terminal devices 500 and the information processing device 600 is, for example, visible light. Each of the receiving devices 200 includes, for example, the light detection element 100 and the signal processing unit 110. The light detection element 100 may be replaced with the light detection element 101 or 102.

While embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light detection element comprising: a magnetic element, a capacitor, and a resistor,
    wherein the magnetic element and the capacitor are connected in series,
    the resistor is connected to the magnetic element and the capacitor in parallel,
    the magnetic element includes a first ferromagnetic layer, a second ferromagnetic layer, and a spacer layer sandwiched between the first ferromagnetic layer and the second ferromagnetic layer, and
    the magnetic element is configured to be irradiated with a light containing an optical signal with a change of intensity of the light;

the light detection element further comprising a third electrode layer and a second dielectric body, wherein the magnetic element has a first surface and a second surface opposing each other in a laminating direction of the magnetic element, a position of the second dielectric body is between the third electrode layer and the second surface in the laminating direction, and the second dielectric body and the third electrode layer constitute at least a part of the capacitor; and the light detection element further comprising a second connecting via and a fourth electrode layer, wherein the resistor is connected to the third electrode layer branched off from the third electrode layer at a connecting part and the resistor is located between the connecting part and the second connecting via, and the fourth electrode layer is electrically connected to the first surface and the second connecting via, and electrically connected to the third electrode layer via the second connecting via and the resistor.

2. The light detection element according to claim 1, wherein the magnetic element is configured to be irradiated with the light from a side of the first surface.

3. The light detection element according to claim 1, further comprising a first electrode layer and a first dielectric body, wherein the magnetic element has a first surface and a second surface opposing each other in a laminating direction of the magnetic element, the first electrode layer is electrically connected to the first surface, a slit filled with the first dielectric body is provided in the first electrode layer, and the first dielectric body and the first electrode layer constitute at least a part of the capacitor.

4. The light detection element according to claim 3, further comprising a first connecting via and a second electrode layer, wherein the resistor is connected to the first electrode layer branched off from the first electrode layer at a connecting part, the resistor is located between the connecting part of the first electrode layer and the first connecting via, the slit is located between the magnetic element and the connecting part, and the second electrode layer is electrically connected to the second surface and the first connecting via, and electrically connected to the first electrode layer via the first connecting via and the resistor.

5. The light detection element according to claim 3, wherein the magnetic element is configured to be irradiated with the light from a side of the first surface.

6. A receiving device comprising a magnetic element and a circuit, wherein the circuit includes a capacitor connected to the magnetic element in series, and a resistor connected to the magnetic element and the capacitor in parallel, wherein the magnetic element includes a first ferromagnetic layer, a second ferromagnetic layer, and a spacer layer sandwiched between the first ferromagnetic layer and the second ferromagnetic layer, the magnetic element is configured to be irradiated with a light containing an optical signal with a change of intensity of the light, the circuit is connected to the magnetic element and is configured to output a voltage with a magnitude corresponding to an amount of change per unit time of an output voltage output from the magnetic element according to the optical signal, and the receiving device is configured to receive the optical signal on a basis of the voltage output from the circuit;

the receiving device further comprising a third electrode layer and a second dielectric body, wherein the magnetic element has a first surface and a second surface opposing each other in a laminating direction of the magnetic element, a position of the second dielectric body is between the third electrode layer and the second surface in the laminating direction, and the second dielectric body and the third electrode layer constitute at least a part of the capacitor; and the receiving device further comprising a second connecting via and a fourth electrode layer, wherein the resistor is connected to the third electrode layer branched off from the third electrode layer at a connecting part and the resistor is located between the connecting part and the second connecting via, and the fourth electrode layer is electrically connected to the first surface and the second connecting via, and electrically connected to the third electrode layer via the second connecting via and the resistor.

* * * * *